(12) United States Patent
Pang et al.

(10) Patent No.: US 9,460,805 B1
(45) Date of Patent: Oct. 4, 2016

(54) WORD LINE DEPENDENT CHANNEL PRE-CHARGE FOR MEMORY

(71) Applicant: SanDisk Technologies Inc., Plano, TX (US)

(72) Inventors: Liang Pang, Fremont, CA (US); Jiahui Yuan, Fremont, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/886,532

(22) Filed: Oct. 19, 2015

(51) Int. Cl.
  *G11C 16/10* (2006.01)
  *G11C 16/34* (2006.01)
  *G11C 16/04* (2006.01)
  *G11C 16/12* (2006.01)

(52) U.S. Cl.
  CPC ....... *G11C 16/3431* (2013.01); *G11C 16/0483* (2013.01); *G11C 16/10* (2013.01); *G11C 16/12* (2013.01)

(58) Field of Classification Search
  CPC .............................. G11C 16/10; G11C 16/26
  USPC ........................................ 365/185.17, 185.24
  See application file for complete search history.

(56) References Cited

U.S. PATENT DOCUMENTS

| 7,561,468 | B2 | 7/2009 | Hosono | |
|---|---|---|---|---|
| 8,194,465 | B2 | 6/2012 | Namiki et al. | |
| 8,385,115 | B2 * | 2/2013 | Lee | G11C 16/0483 365/185.02 |
| 8,488,386 | B2 | 7/2013 | Kim et al. | |
| 8,804,430 | B2 | 8/2014 | Lai et al. | |
| 8,854,896 | B2 | 10/2014 | Hosono et al. | |
| 9,171,627 | B2 * | 10/2015 | Lee | G11C 16/10 |
| 2009/0316489 | A1 * | 12/2009 | Han | G11C 11/5642 365/185.25 |
| 2010/0054036 | A1 * | 3/2010 | Lee | G11C 16/0483 365/185.03 |
| 2011/0069557 | A1 | 3/2011 | Namiki et al. | |
| 2012/0307561 | A1 | 12/2012 | Joo et al. | |
| 2013/0250690 | A1 | 9/2013 | Lai et al. | |
| 2013/0279261 | A1 * | 10/2013 | Hazama | G11C 16/10 365/185.18 |
| 2014/0269083 | A1 * | 9/2014 | Mui | G11C 11/5642 365/185.17 |
| 2014/0334232 | A1 | 11/2014 | Nam et al. | |
| 2015/0003151 | A1 * | 1/2015 | Lee | G11C 16/10 365/185.02 |
| 2015/0009758 | A1 * | 1/2015 | Jang | G11C 16/24 365/185.17 |
| 2015/0179269 | A1 * | 6/2015 | Lee | G11C 16/14 365/185.03 |

* cited by examiner

*Primary Examiner* — Michael Tran
(74) *Attorney, Agent, or Firm* — Vierra Magen Marcus LLP

(57) ABSTRACT

Techniques are provided for programming a memory device. A pre-charge phase is used to boost the channel of an unselected NAND string by allowing a bit line voltage to reach the channel. To maximize the channel pre-charge while also minimizing program disturb, a drain-side dummy word line voltage is controlled based on the position of the selected word line. The drain-side dummy word line voltage can be relatively high or low when the selected word line is relatively far from or close to the drain-side dummy word line, respectively. When the drain-side dummy word line voltage is relatively high, the bit line voltage can easily pass through and boost the channel. When the drain-side dummy word line voltage is relatively low, program disturb of drain-side data word lines is reduced due to a smaller channel gradient and a corresponding reduced amount of hot carriers.

20 Claims, 17 Drawing Sheets

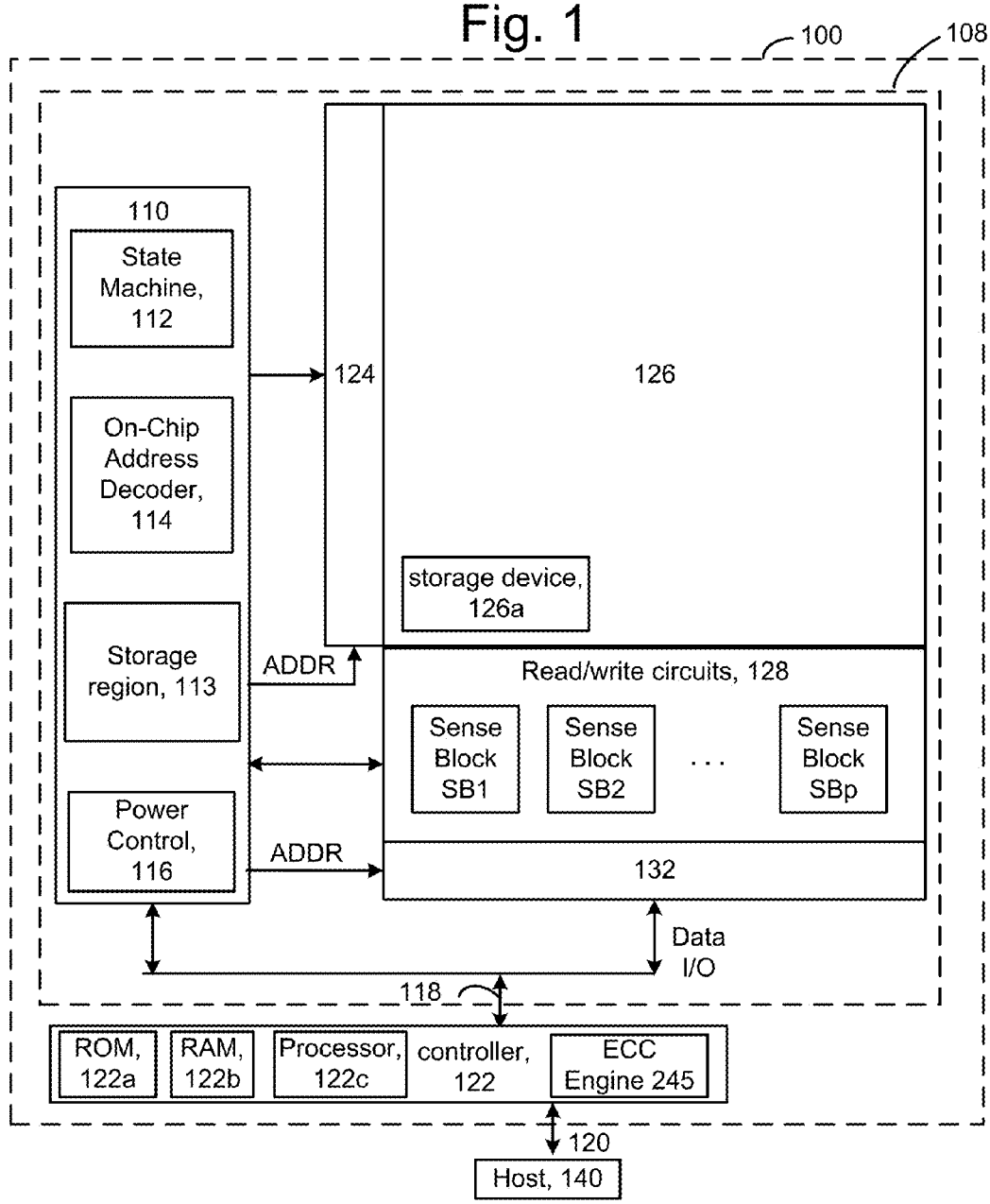

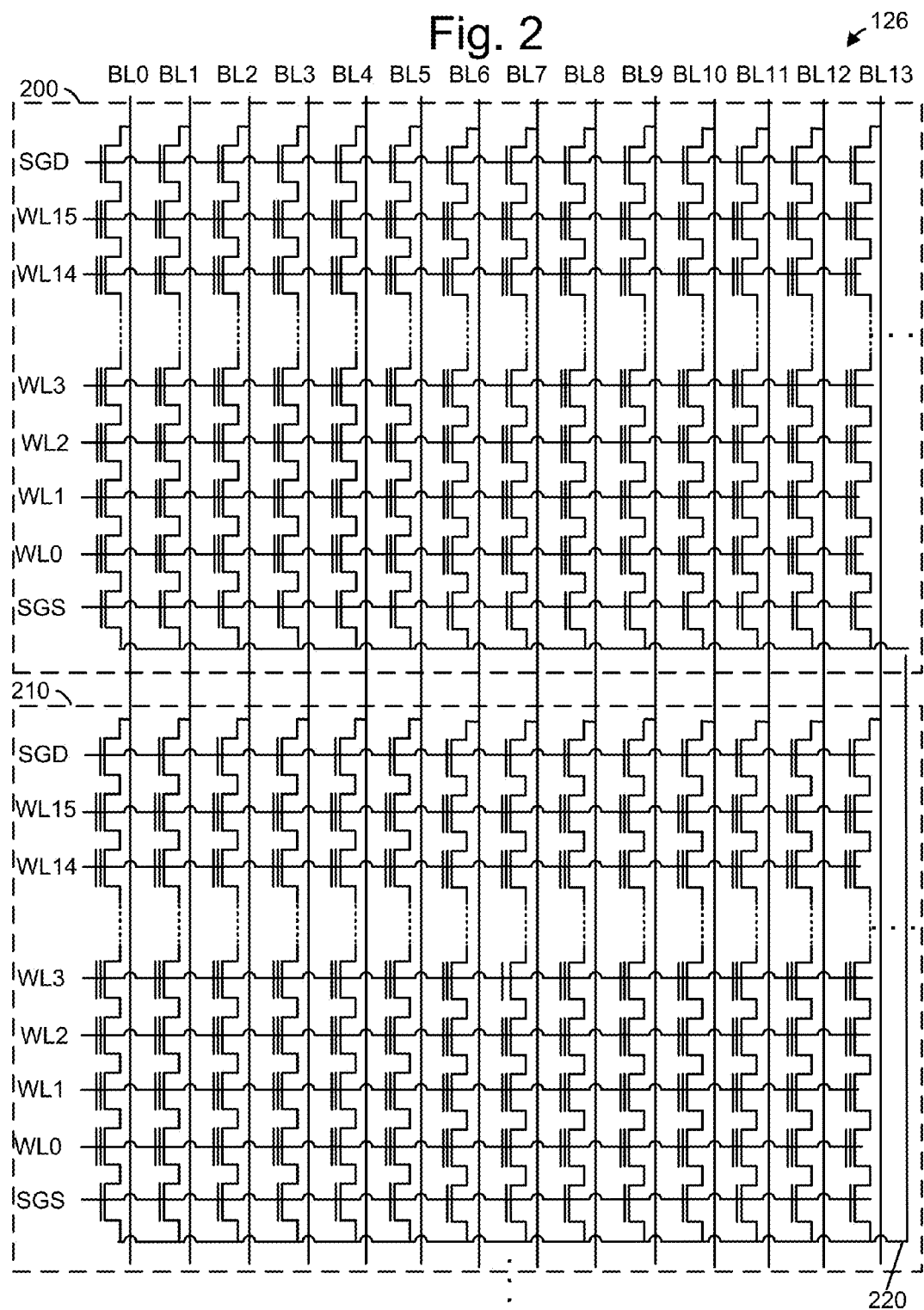

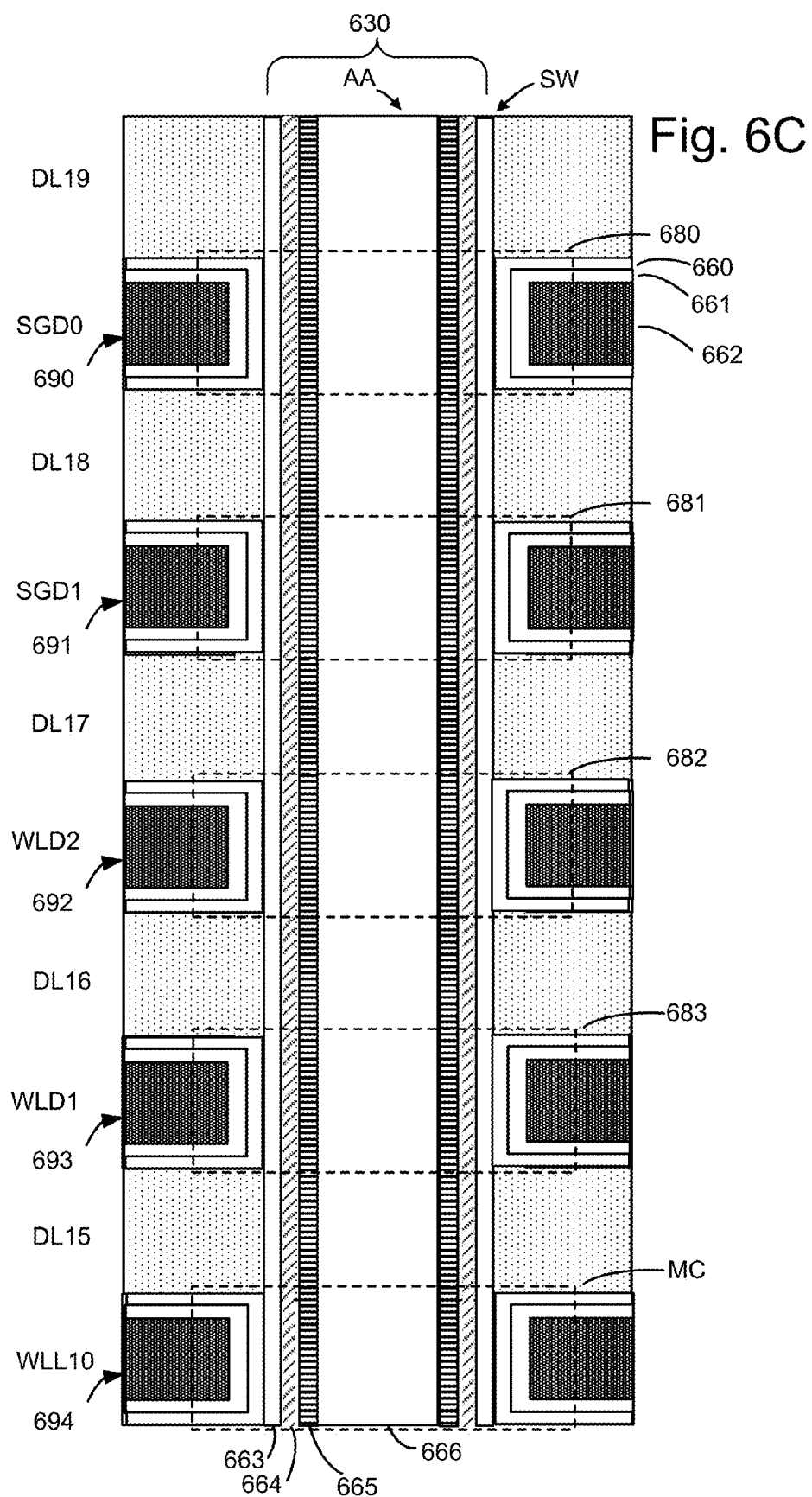

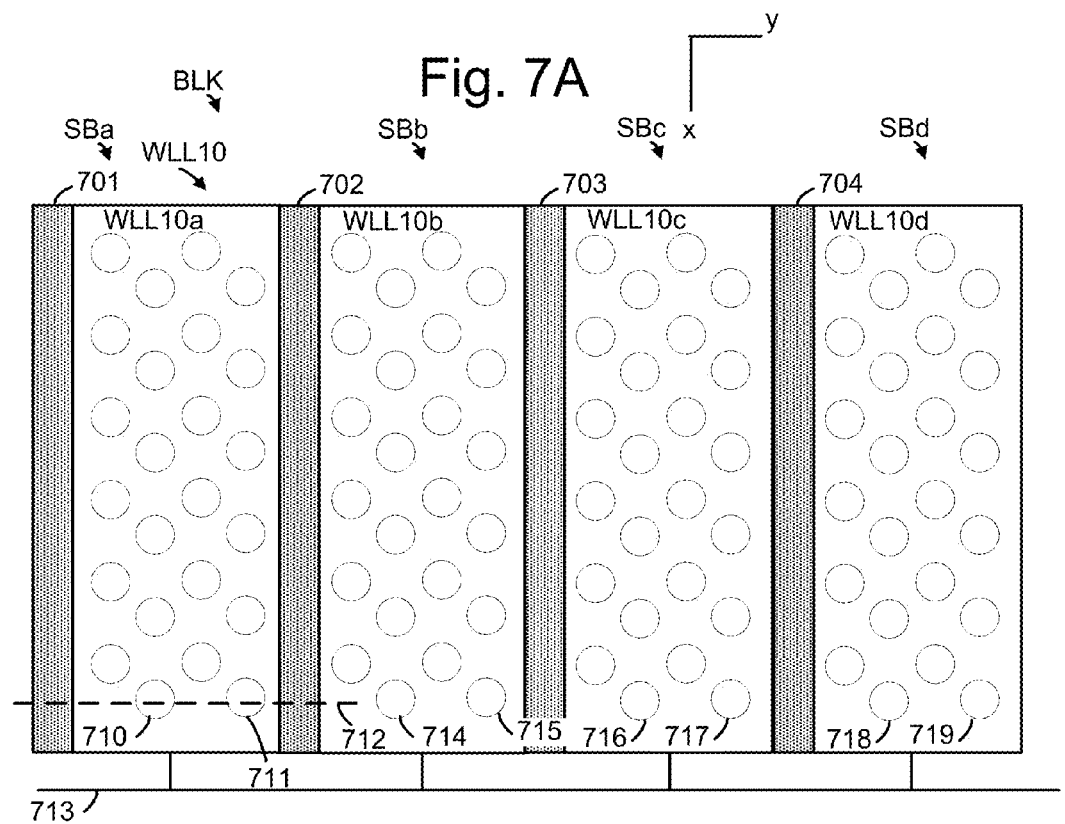
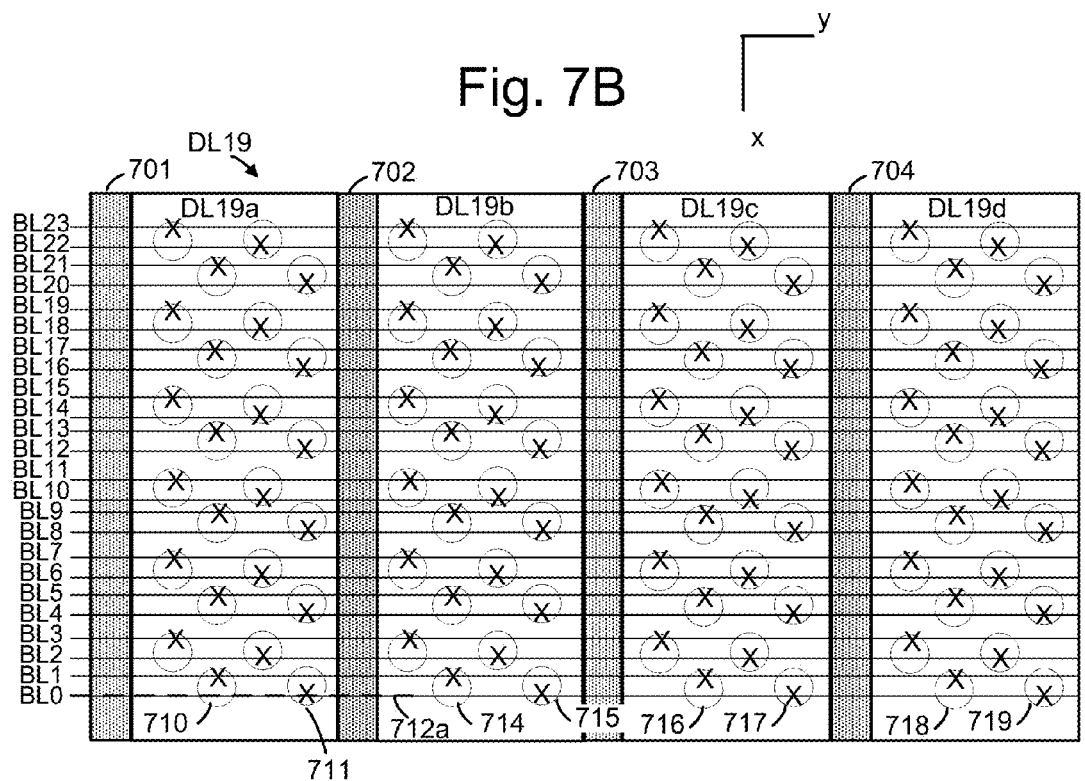

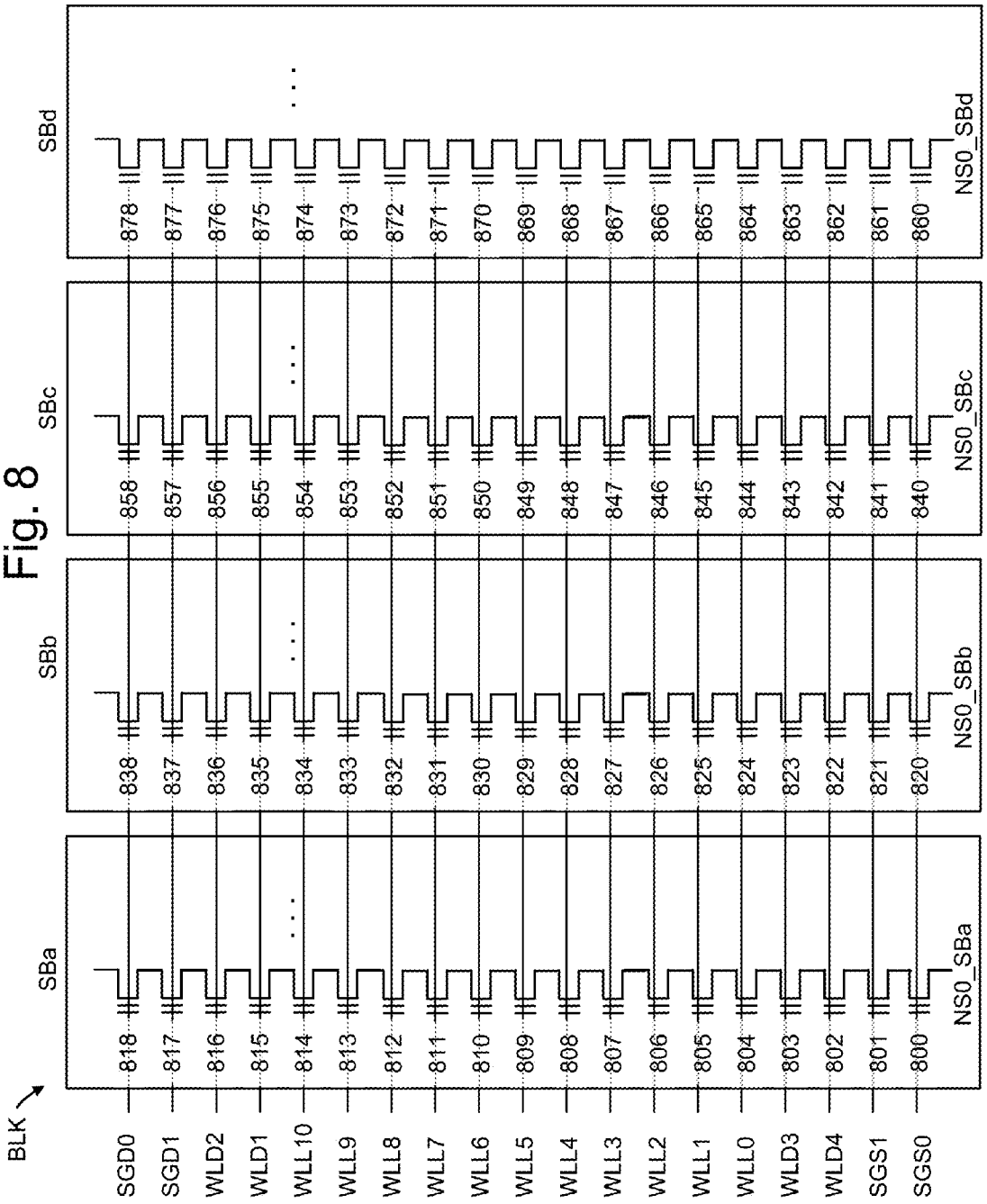

US 9,460,805 B1

WORD LINE DEPENDENT CHANNEL PRE-CHARGE FOR MEMORY

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 1 is a block diagram of an example memory device.

FIG. 2 depicts blocks of memory cells in an example two-dimensional configuration of the memory array 126 of FIG. 1.

FIG. 6C depicts a close-up view of the region 622 of the stack of FIG. 6A.

FIG. 7A depicts a top view of an example word line layer WLL10 of the stack of FIG. 6A.

FIG. 7B depicts a top view of an example top dielectric layer DL19 of the stack of FIG. 6A.

FIG. 8 depicts example NAND strings in the sub-blocks SBa-SBd of FIG. 7A.

DETAILED DESCRIPTION

Techniques are provided for programming a memory device in a way which reduces program disturb. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block.

Figure 11:
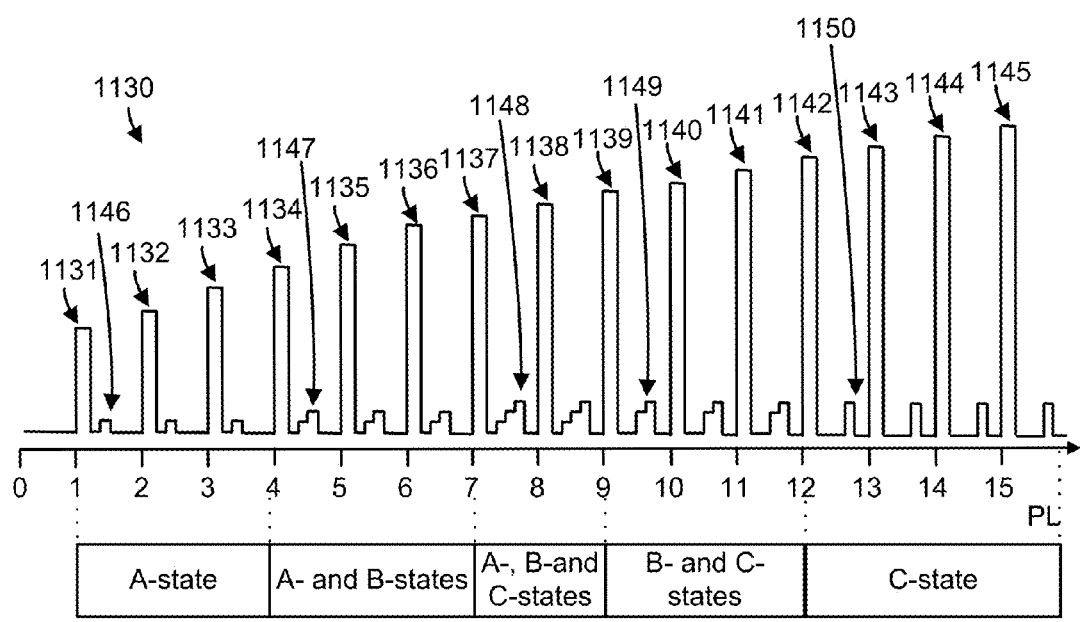
FIG. 11 depicts a waveform of an example programming operation, consistent with FIG. 10.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 11. Verify operations may be performed after each program voltage to determine whether the memory cells have completed programming. When programming is completed for a memory cell, it can be locked out from further programming while programming continues for other memory cells in subsequent program loops.

Thus, during each program loop, a selected NAND string includes a memory cell which is selected for programming and an unselected NAND string does not include a memory cell which is selected for programming. A given NAND string can be selected at the start of a programming operation and become unselected as its memory cell on the selected word line completes programming A NAND string connected to a memory cell on the selected word line which is to remain in the erased state will remain as an unselected NAND string.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states (see FIG. 12B). In a three-bit per cell memory device, there are eight data states including the erased state and seven higher data states referred to as the A, B, C, D, E, F and G data states (see FIG. 13). In a four-bit per cell memory device, there are sixteen data states including the erased state and fifteen higher data states referred to as the A, B, C, D, E, F, G, H, I, J, K, L, M, N and O data states.

However, memory cells can be inadvertently programmed due to program disturb when the program voltage is applied. Program disturb can be caused by capacitive coupling from the selected word line to respective memory cells in an unselected word line, in one approach. For example, memory cells of the unselected NAND strings can be disturbed by voltages applied to word lines which are shared by the unselected NAND strings and the selected NAND strings. Memory cells which are to remain in the erased state based on the write data are most susceptible to program disturb. Program disturb causes an increase in their Vth can result in a read error. To reduce program disturb, the channel of the unselected NAND string is boosted before the program voltage is applied. The boosting is primary provided by an increase in voltages (Vpass) of the unselected word lines, e.g., from 0 V to 8-9 V. This increase couples to the channel. Moreover, the select gate transistors at each end of the unselected NAND string are provided in a non-conductive state so that the channel voltages can float higher due to the capacitive coupling.

To provide additional boosting before Vpass is increased, a pre-charge may be introduced into the channel via the bit line while the SGD transistor is in a conductive state. In one approach, a dummy word line is connected to a dummy memory cell, which is ineligible to store data. One or more dummy memory cells may be provided at the drain end of a NAND string to provide a gradual transition in channel gradient. To allow the pre-charge to pass throughout the channel, the dummy word line may be provided at a relatively high voltage to provide the dummy memory cell in a strongly conductive state. However, this can increase a channel gradient between a dummy word line and the drain-side data word line, thereby generating electron-hole pairs in which electrons can degrade the boosting potential.

Moreover, when the selected word line is relatively closer to the source side of the unselected NAND string than to its drain side, there will be many memory cells between the selected word line and the dummy word line and these memory cells will be in an erased state as a result of the word line programming order. Even with a low voltage such as 0 V on the control gates of these memory cells, the channel regions under these memory cells will be in a relatively highly conductive state so that the electrons can travel through and dissipate in the channel. This is true because the Vth of the erased state memory cells may be less than 0 V, such as less than −1 V. A memory cell is in a conductive state when its control gate voltage exceeds the sum of its Vth and its drain voltage. This conductive portion of the channel has a relatively high capacitance and can absorb the generated electrons. However, when the selected word line is relatively closer to the drain side of the unselected NAND string than to its source side, there will be no, or few, memory cells between the selected word line and the dummy word line. The conductive portion of the channel which is available to absorb the electrons is therefore relatively small. As a result, the electrons are more likely to degrade the boosting potential.

In fact, the electrons can travel the distance of several memory cells at the drain end of the unselected NAND string. Techniques provided herein address the above and other issues. In one aspect, to maximize the channel pre-charge while also minimizing program disturb, a drain-side dummy word line voltage is controlled based on the position of the selected word line. The drain-side dummy word line voltage can be relatively high or low when the selected word line is relatively far from or close to the drain-side dummy word line, respectively. Thus, the drain-side dummy word line voltage has a range of adjustment. When the drain-side dummy word line voltage (Vwld1) is relatively high, the bit line voltage can easily pass through and boost the channel. When the drain-side dummy word line voltage is relatively low, program disturb of drain-side data word lines is reduced due to a smaller channel gradient and a corresponding reduced amount of hot carriers.

In one approach, the higher value of Vwld1 is used when the selected word line is among a first group of word lines which comprises, e.g., 50-75% or 50-80% of the data word lines, and the lower value of Vwld1 is used when the selected word line is among a remainder (20-50%) of the data word lines. In one approach, a second drain-side dummy word line is used which has a smaller range of adjustment than the range of adjustment of the first drain-side dummy word line.

Various other features and benefits are described below.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for programming parameters as described further below, e.g., in connection with the process of FIG. 10.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the flowchart of FIG. 10. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
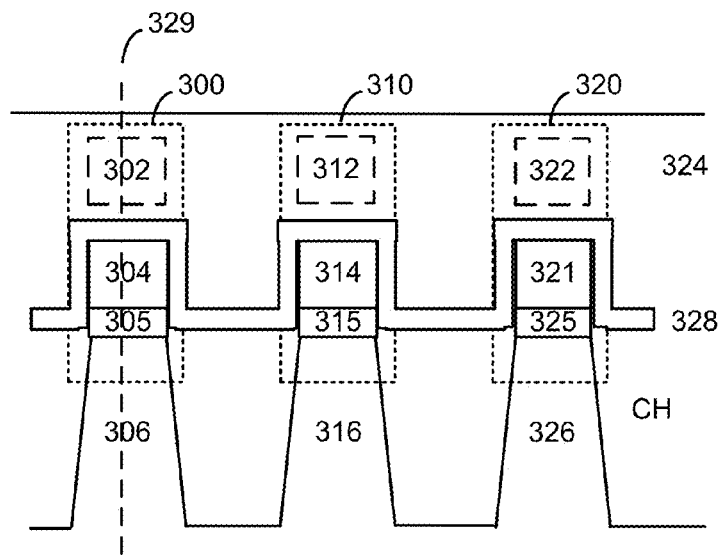
FIG. 3A depicts a cross-sectional view of example floating gate memory cells in NAND strings.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
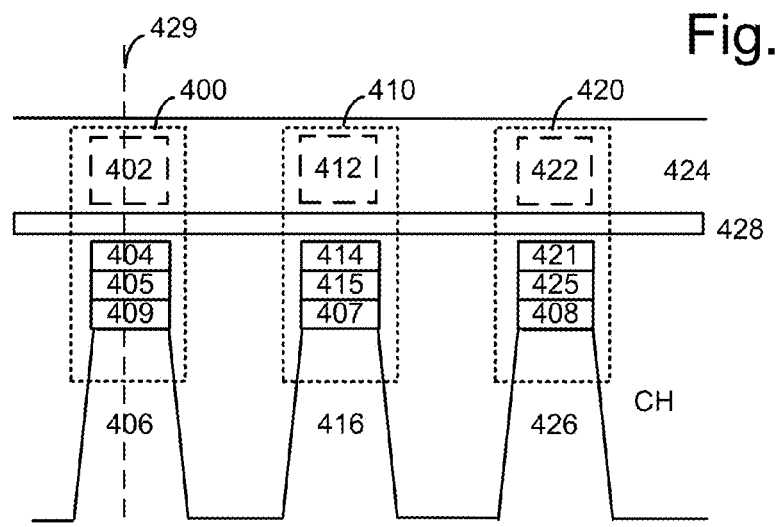
FIG. 4A depicts a cross-sectional view of example charge-trapping memory cells in NAND strings.
Figure 4B:
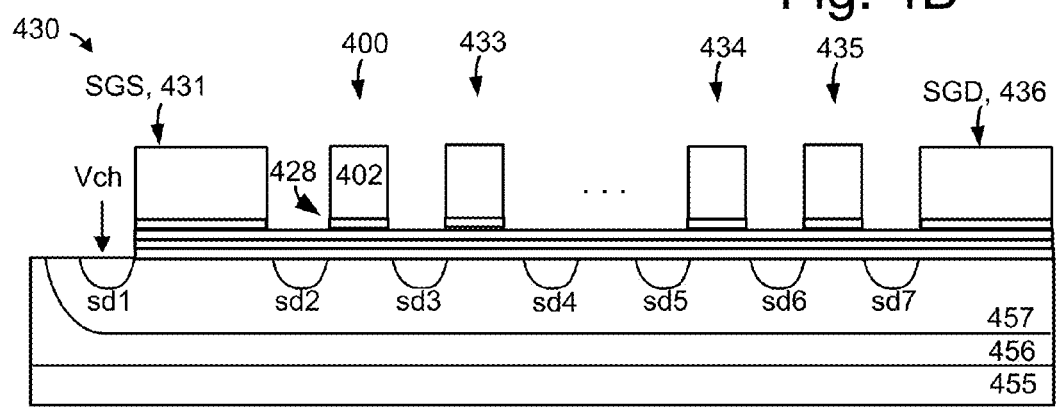
FIG. 4B depicts a cross-sectional view of the structure of FIG. 4A along line 429.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
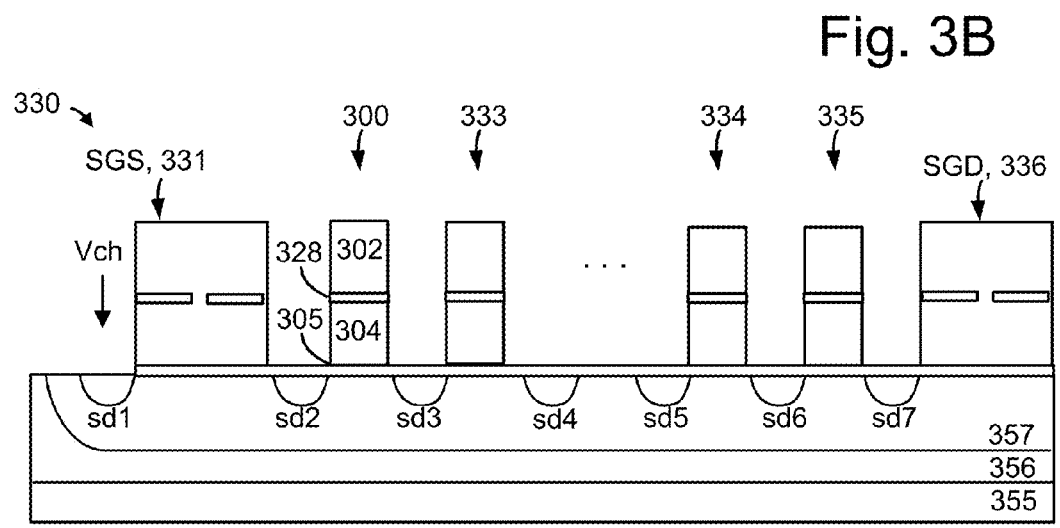
FIG. 3B depicts a cross-sectional view of the structure of FIG. 3A along line 329.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5:
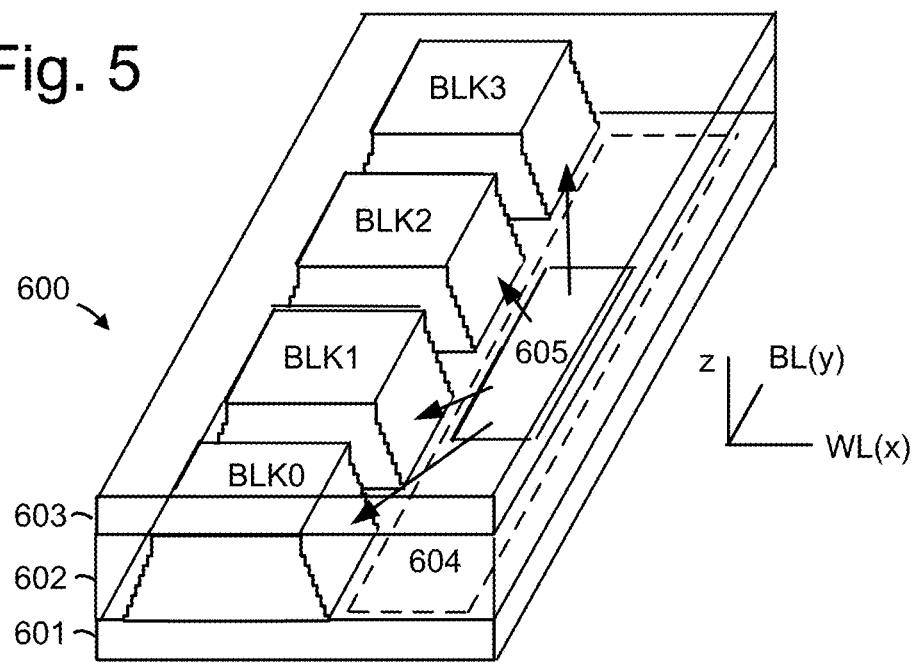
FIG. 5 is a perspective view of a memory device 600 comprising a set of blocks in an example three-dimensional configuration of the memory array 126 of FIG. 1.

FIG. 5 is a perspective view of a memory device 600 comprising a set of blocks in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6A:
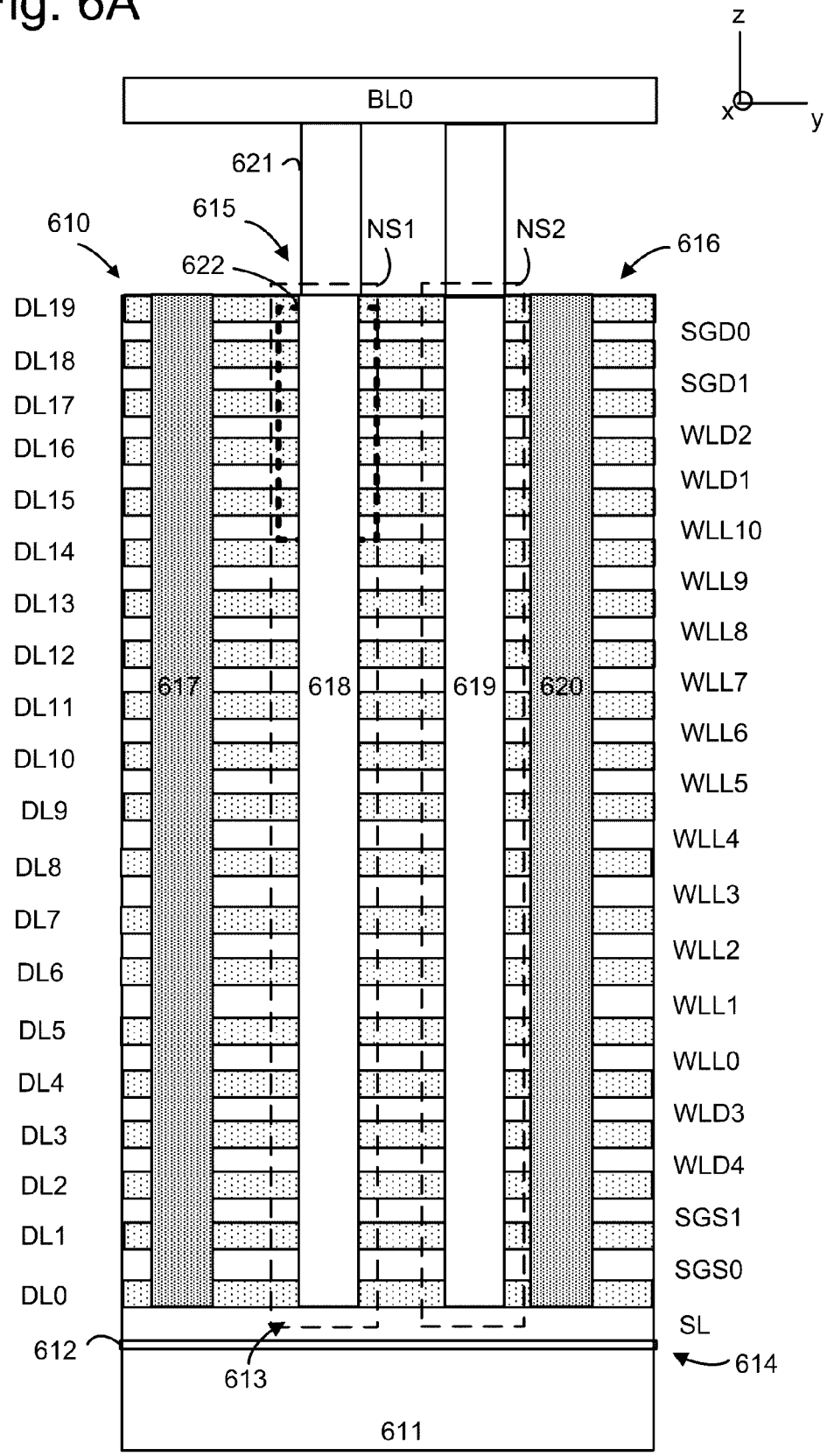
FIG. 6A depicts an example cross-sectional view of a portion of one of the blocks of FIG. 5.

FIG. 6A depicts an example cross-sectional view of a portion of one of the blocks of FIG. 5. The block comprises a stack 610 of alternating conductive and dielectric layers. In this example, the conductive layers comprise two SGD layers, two SGS layers and four dummy word line layers WLD1, WLD2, WLD3 and WLD4, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6C.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack, such as to interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6B:
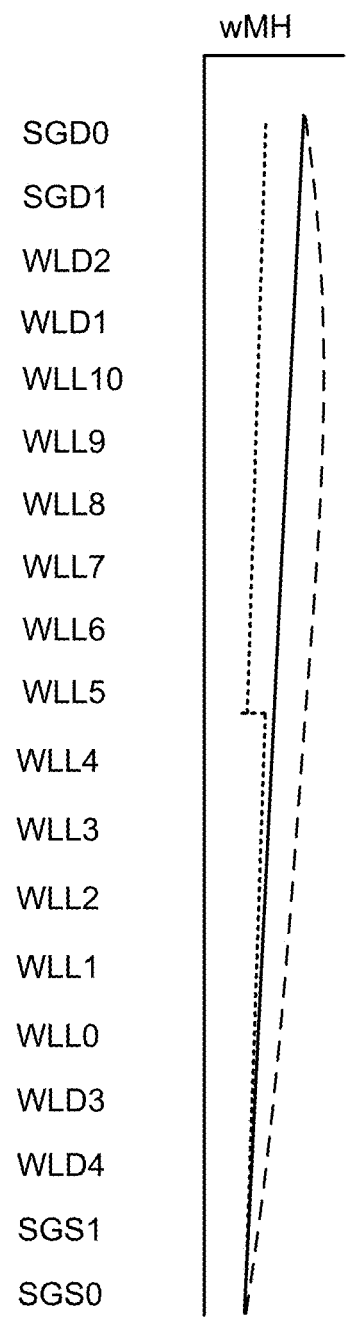
FIG. 6B depicts a plot of memory hole diameter in the stack of FIG. 6A.

FIG. 6B depicts a plot of memory hole diameter in the stack of FIG. 6A. The vertical axis is aligned with the stack of FIG. 6A and depicts a width (wMH), e.g., diameter, of the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole (solid line in FIG. 6B). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 6B). For example, the memory hole width is a maximum at the level of WL9 in the stack, in this example. The memory hole width is slightly smaller at the level of WL10, and progressively smaller at the levels of WL8 to WL0.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Due to the non-uniformity in the width of the memory hole, the programming and erase speed of the memory cells can vary based on their position along the memory hole, e.g., based on their height in the stack. With a smaller diameter memory hole, the electric field across the tunnel oxide is relatively stronger, so that the programming and erase speed is relatively higher.

A block may comprise a three-dimensional structure in which the memory cells are arranged along vertical memory holes, the vertical memory holes have varying diameters; and each subset is associated with portions of the vertical memory holes having similar diameters.

FIG. 6C depicts a close-up view of the region 622 of the stack of FIG. 6A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts a top view of an example word line layer WLL10 of the stack of FIG. 6A. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions WLL10a, WLL10b, WLL10c and WLL10d which are each connected by a connector 713. The last region of a word line layer in a block can be connected to a first region of a word line layer in a next block, in one approach. The connector, in turn, is connected to a voltage driver for the word line layer. The region WLL10a has example memory holes 710 and 711 along a line 712. See also FIGS. 7B and 8. The region WLL10b has example memory holes 714 and 715. The region WLL10c has example memory holes 716 and 717. The region WLL10d has example memory holes 718 and 719. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Each circle can alternatively represent a memory cell which is provided by the materials in the memory hole and by the adjacent word line layer.

Metal-filled slits 701, 702, 703 and 704 (e.g., metal interconnects) may be located between and adjacent to the edges of the regions WLL10a-WLL10d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8 for further details of the sub-blocks SBa-SBd of FIG. 7A.

FIG. 7B depicts a top view of an example top dielectric layer DL19 of the stack of FIG. 6A. The dielectric layer is divided into regions DL19a, DL19b, DL19c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

FIG. 8 depicts example NAND strings in the sub-blocks SBa-SBd of FIG. 7A. The sub-blocks are consistent with the structure of FIG. 6A. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

Memory cells on WL8 include memory cells 812, 832, 852 and 872. Memory cells on WL9 include memory cells 813, 833, 853 and 873. In this example, the programming of the block may occur sub-block by sub-block. For example, SBa may be programmed from WLL0-WLL10, then SBb may be programmed from WLL0-WLL10, then SBc may be programmed from WLL0-WLL10 and then SBd may be programmed from WLL0-WLL10.

Figure 9A:
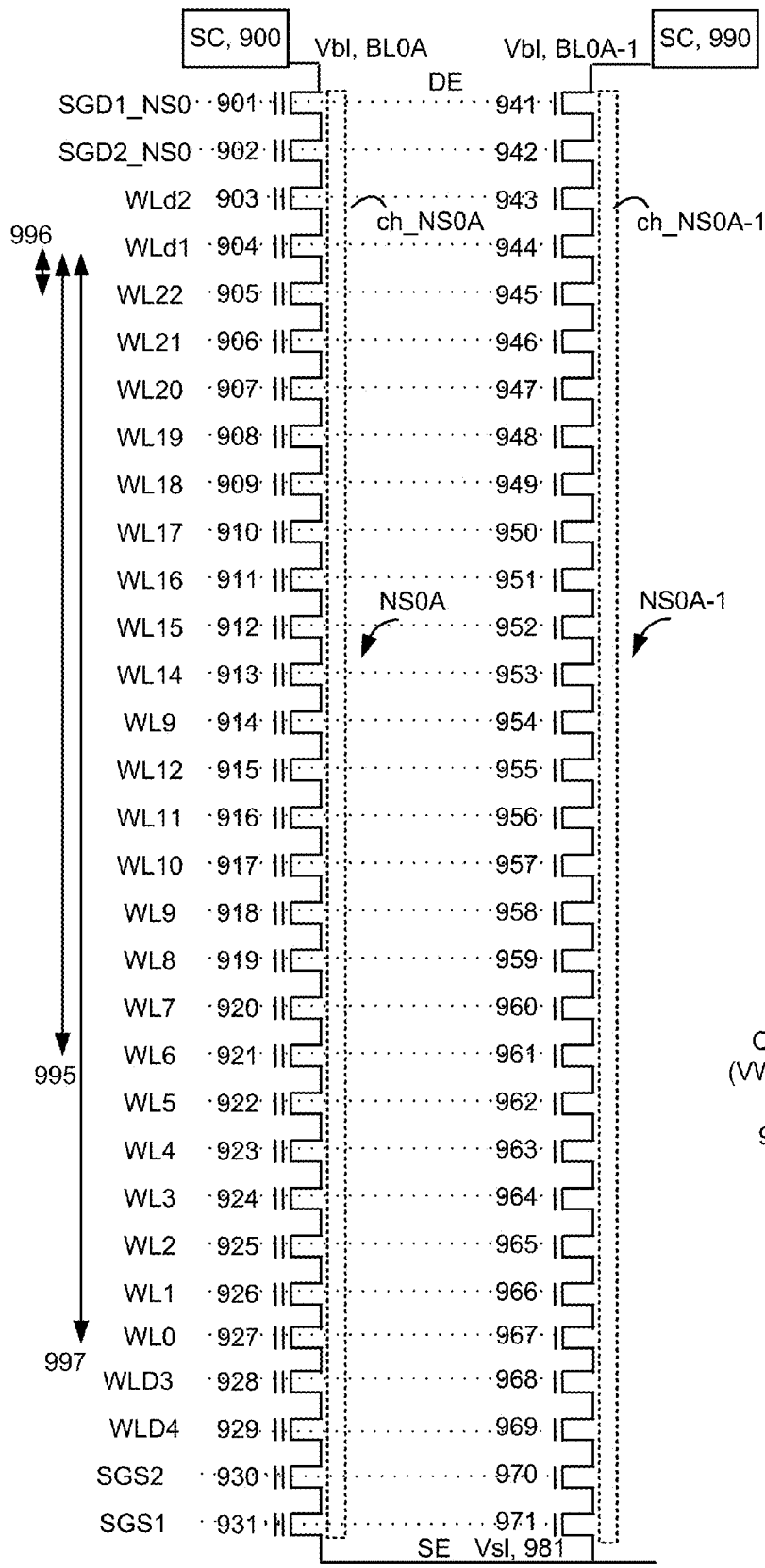
FIG. 9A depicts a circuit diagram of example NAND strings NS0A and NS0A-1.

FIG. 9A depicts a circuit diagram of example NAND strings NS0A and NS0A-1.

The word lines for data memory cells are WL0-WL21. WL0-WL21 are connected to data memory cells 927-905, respectively, in NS0A and to data memory cells 967-945, respectively, in NS0A-1. Dummy word lines WLD1, WLD2, WLD3 and WLD4 are connected to dummy memory cells 904, 903, 928 and 929, respectively, in NS0A and to dummy memory cells 944, 943, 968 and 969, respectively, in NS0A-1. The word lines are connected to both the selected and unselected NAND strings. An SGD line, SGD1_NS0 is connected to the SGD transistors 901 and 941 while an SGD line, SGD2_NS0 is connected to the SGD transistors 902 and 942.

An SGS line, SGS1 is connected to the SGS transistors 931 and 971, and an SGS line, SGS2 is connected to the SGS transistors 930 and 970.

A channel of NS0A is ch_NS0A and a channel of NS0A-1 is ch_NS0A-1. A current in the channel of NS0A is sensed by sensing circuitry (SC) 900 via a bit line BL0A which is at a voltage, Vb1. A current in the channel of NS0A-1 is sensed by sensing circuitry (SC) 990 via a bit line BL0A-1 which is at a voltage, Vb1.

A source line 981 is connected to source ends of the NAND strings. Voltage drivers can be used to provide voltages on the control lines (e.g., word lines, select gate lines, bit line and source line).

A set of memory cells is provided in NS0A. An arrow 995 depicts a distance between an example selected word line, WLsel=WL6, and a first drain-side dummy word line, WLD1. An arrow 996 depicts a minimum distance and an arrow 997 depicts a maximum distance.

As an example, NS0A may be a selected NAND string comprising a selected memory cell 921, and unselected memory cells 905-920 and 922-927 including a drain-end or drain-side memory cell 905. NS0A-1 may be an unselected NAND string comprising an unselected memory cell 961 which corresponds to the selected memory cell, and remaining unselected memory cells 945-960 and 962-967 including a drain-end or drain-side memory cell 945.

Figure 9B:
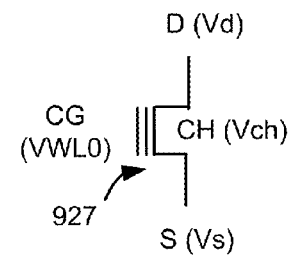
FIG. 9B depicts the example memory cell 927 of FIG. 9A.

FIG. 9B depicts the example memory cell 927 of FIG. 9A. The memory cell comprises a control gate CG which receives a word line voltage Vw110, a drain at a voltage Vd, a source at a voltage Vs and a channel at a voltage Vch.

Figure 10:
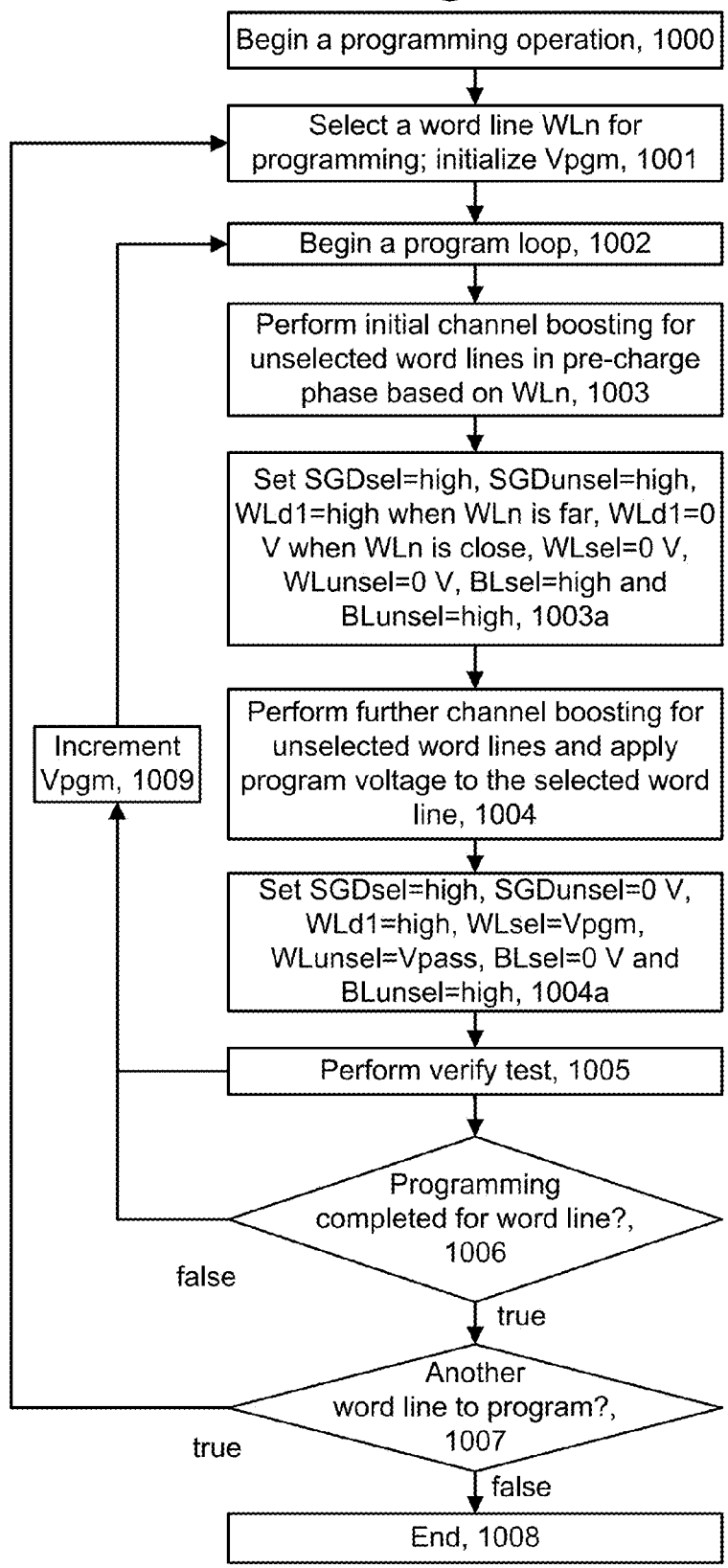
FIG. 10 depicts an example programming operation in which a pre-charge voltage is based on a selected word line position.

FIG. 10 depicts an example programming operation in which a pre-charge voltage is based on a selected word line position. Step 1000 begins a programming operation. Step 1001 selects a word line (WLn) for programming and initializes Vpgm. Step 1002 begins a program loop or program-verify iteration. Step 1003 performs initial channel boosting for unselected word lines in a pre-charge phase of the program loop based on WLn. As part of this step, step 1003a includes setting SGDsel=high, SGDunsel=high, WLd1=high when WLn is far, WLd1=0 V when WLn is close, WLsel=0 V, WLunsel=0 V, BLsel=high and BLunsel=high. Step 1004 performs further channel boosting for the unselected word lines and applies a program voltage to the selected word line. As part of this step, step 1004a includes SGDsel=high, SGDunsel=0 V, WLd1=high, WLsel=Vpgm, WLunsel=Vpass, BLsel=0 V and BLunsel=high. See FIG. 16A-16E for further details.

Step 1005 determines one or more data states to verify and performs the corresponding verify test or tests. For example, in FIG. 11, the A state cells are verified at program loops 1-4, the B state cells are verified at program loops 4-7 and the C state cells are verified at program loops 7-10.

Decision step 1006 determines if programming is completed for the current word lines. Decision step 1006 is true if all, or nearly all of the memory cells which are to be programmed have passed their respective verify test. A memory cell passes a verify test when a verify voltage is applied to its control gate via a word line and the memory cell is determined by sensing circuitry to be in a non-conductive state. In this case, the Vth of the memory cell exceeds the verify voltage. If decision step 1006 is false, Vpgm is incremented at step 1009, and a next program loop is performed at step 1002. If decision step 1006 is true, decision step 1007 determines whether there is another word line to program. If decision step 1007 is false, the programming operation ends at step 1008. If decision step 1007 is true, a new word line is selected to be programmed at step 1001.

In this example, programming for a selected word line is completed before starting programming of another word line. In another approach, the programming occurs in a back and forth word line order. In this case, a programming pass may occur for a word line WLn, then for another word line such as WLn+1, then for WLn again and so forth. This approach can reduce capacitive coupling effects which are common in floating gate memory devices, and may be used in general with any type of memory device. In the back and forth word line order, multiple programming passes are used on each word line but the programming passes for a given word line are non-sequential.

FIG. 11 depicts a waveform of an example programming operation, consistent with FIG. 10. The horizontal axis depicts a program loop number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

For each program voltage, a square waveform is depicted for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming pass in which the programming is completed. ISPP can also be used in each programming pass of a multi-pass operation.

A pulse train typically includes program voltages which increase stepwise in amplitude in each program-verify iteration using a fixed or varying step size. A new pulse train can be applied in each programming pass of a multi-pass programming operation, starting at an initial Vpgm level and ending at a final Vpgm level which does not exceed a maximum allowed level. The initial Vpgm levels can be the same or different in different programming passes. The final Vpgm levels can also be the same or different in different programming passes. The step size can be the same or different in the different programming passes. In some cases, a smaller step size is used in a final programming pass to reduce Vth distribution widths.

The pulse train 1130 includes a series of program voltages 1131, 1132, 1133, 1134, 1135, 1136, 1137, 1138, 1139, 1140, 1141, 1142, 1143, 1144 and 1145 that are applied to a word line selected for programming, and an associated set of non-volatile memory cells. One, two or three verify voltages are provided after each program voltage as an example, based on the target data states which are being verified. 0 V may be applied to the selected word line between the program and verify voltages. For example, an A-state verify voltage of VvA (e.g., waveform 1146) may be applied after each of the first, second and third program voltages 1131, 1132 and 1133, respectively. A- and B-state verify voltages of VvA and VvB (e.g., waveform 1147) may be applied after each of the fourth, fifth and sixth program voltages 1134, 1135 and 1136, respectively. A-, B- and C-state verify voltages of VvA, VvB and VvC (e.g., waveform 1148) may be applied after each of the seventh and eighth program voltages 1137 and 1138, respectively. B- and C-state verify voltages of VvB and VvC (e.g., waveform 1149) may be applied after each of the ninth, tenth and eleventh program voltages 1139, 1140 and 1141, respectively. Finally, a C-state verify voltage of VvC (e.g., waveform 1150) may be applied after each of the twelfth, thirteenth, fourteenth and fifteenth program voltages 1142, 1143, 1144 and 1145, respectively.

Figure 12A:
FIGS. 12A and 12B depict Vth distributions of memory cells in an example one-pass programming operation with four data states, consistent with FIG. 10.
Figure 12B:
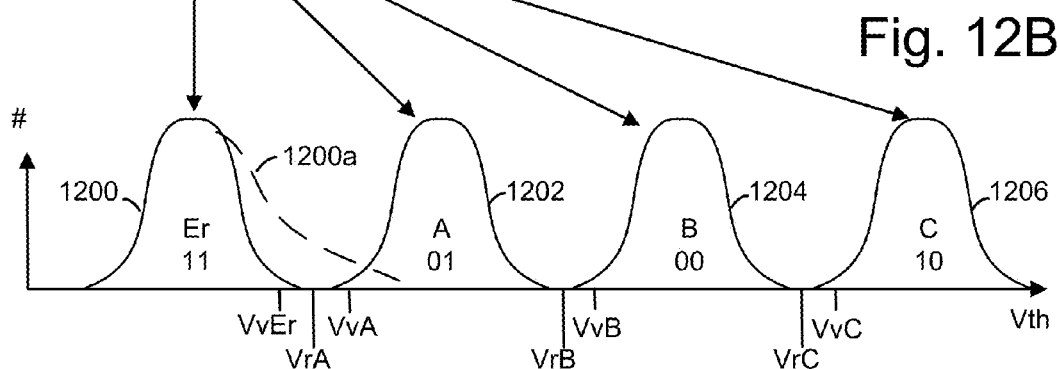

FIGS. 12A and 12B depict Vth distributions of memory cells in an example one-pass programming operation with four data states, consistent with FIG. 10. In this example, the memory cells are initially in the erased state as represented by the Vth distribution 1200 (FIG. 12A). Subsequently, the programming causes the Vth of the A, B and C state cells to reach the Vth distributions 1202, 1204 and 1206, respectively (FIG. 12B). A small number of A, B and C state cells may have a Vth which is below VvA, VvB or VvC, respectively, due to a bit ignore criteria. The Vth distribution 1200a depicts the erased state with program disturb, where the upper tail of the Vth distribution is upshifted.

The memory cells are initially erased to the Vth distribution 1200 using an erase-verify voltage VvEr. A small number of erased state cells may have a Vth which is above VvEr due to a bit ignore criteria. The Vth distribution 1200a may be seen when the erased state memory cells are subject to some type of disturbance, such as program disturb. This can occur due to inadequate channel boosting in an unselected NAND string during the program voltage. Program disturb can result in a relatively large upshift in Vth. For example, the upper tail of the Vth distribution may be above VrA or even above VrB or higher. In this case, there will be uncorrectable errors when reading back the Er state cells.

In this example, there are four possible data states, e.g., the erased (Er) which stores bits 11, the A state which stores bits 01, the B state which stores bits 00 and the C state which stores bits 10.

The A, B and C state cells can be programmed in one or more passes from the erased state to their final Vth distribution using the verify voltages of VvA, VvB and VvC. Additionally, read voltages VrA, VrB and VrC are used to read the data state of a cell by distinguishing between adjacent data states.

In another possible approach, the memory cells can be programmed to a single state such as the A state.

Figure 13:
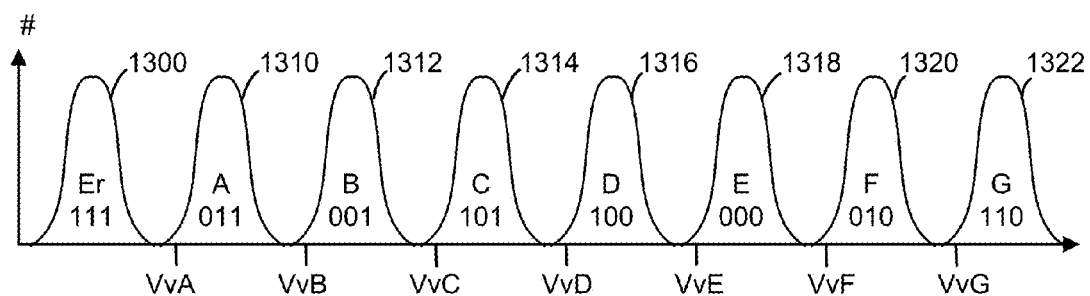
FIG. 13 depicts Vth distributions of memory cells which store data in eight data states using three bits per cell.

FIG. 13 depicts Vth distributions of memory cells which store data in eight data states using three bits per cell. Example bit assignments for each state are depicted. A lower, middle or upper bit can represent data of a lower, middle or upper page, respectively. Seven programmed data states A through G are used in addition to Er. The verify voltages of the A, B, C, D, E, F and G states are VvA, VvB, VvC, VvD, VvE, VvF and VvG, respectively. Programming from the Er state to the programmed data states can occur in one or more program passes. Programming using four or more bits per cell and sixteen or more data states can similarly be performed.

Figure 14A:
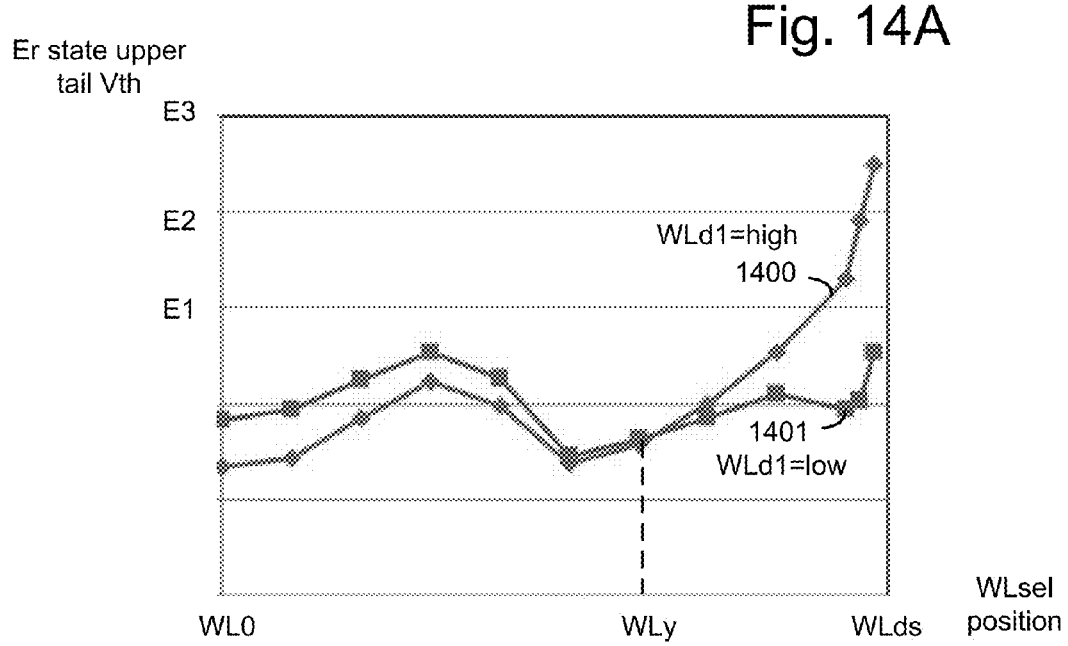
FIG. 14A depicts a plot of a variation in the upper tail of the Vth distribution of erased state memory cells as a function of a selected word line position, and as a function of a dummy word line voltage.

FIG. 14A depicts a plot of a variation in the upper tail of the Vth distribution of erased state memory cells as a function of a selected word line position, and as a function of a dummy word line voltage. The plot is to scale and the vertical and horizontal axes has a linear scale. The horizontal axis represents a position along a NAND string, starting from the source-side data word line WL0 and extending to the drain-side data word line, WLds, e.g., the last data word line on the drain side of the NAND string. The vertical axis depicts a +3 sigma upper tail Vth for the erased state memory cells.

Plot 1400 (line with diamond markers) depicts the case of WLd1=high such as 5 V. Plot 1401 (line with square markers) depicts the case of WLd1=low such as 0 V. This data indicates that when the selected word line, WLse1, is less than or equal to a particular word line, WLy, the upshift in the Vth is slightly lower when WLd1=high is used. When WLse1 is greater than or equal to WLy, the upshift in the Vth is significantly lower when WLd1=0 V. Accordingly, by setting the dummy word line voltage, e.g., WLd1, to be relatively lower when WLse1 is relatively closer to the dummy word line, program disturb can be decreased.

Therefore, we propose to dynamically change a drain-side dummy word line voltage such as WLd1 based on which word line is currently selected for programming, e.g., based on the distance between the selected word line and the dummy word line. A higher WLd1 can be used when programming WL0-WLy−1, for instance, and a lower WLd1 can be used when programming WLy-WLds. As a result, a low level of program disturb can be maintained for all positions of the selected word line. The overall level of program disturb for a block is therefore improved.

Figure 14B:
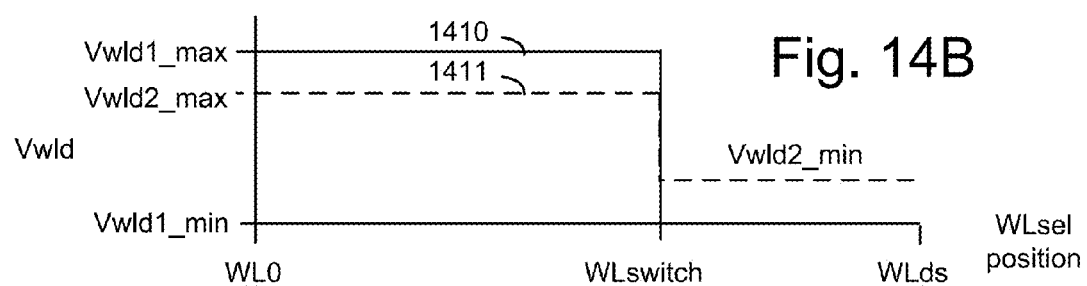
FIG. 14B depicts a plot of dummy word line voltages as a function of a selected word line position, consistent with FIG. 14A, where two levels of voltages are used.
Figure 14C:
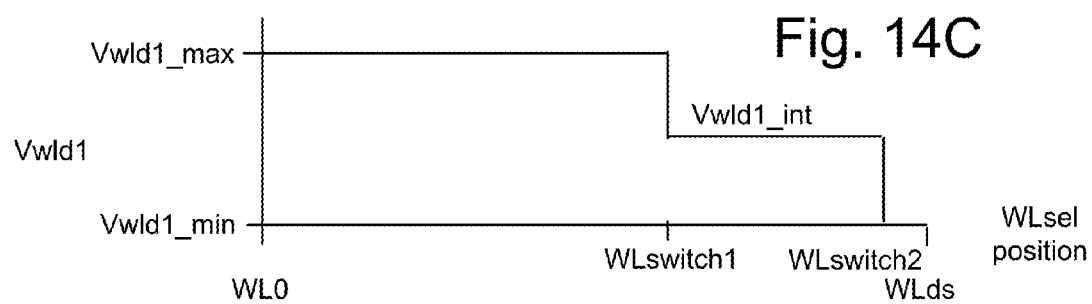
FIG. 14C depicts a plot of dummy word line voltages as a function of a selected word line position, consistent with FIG. 14A, where three levels of voltages are used.
Figure 14D:
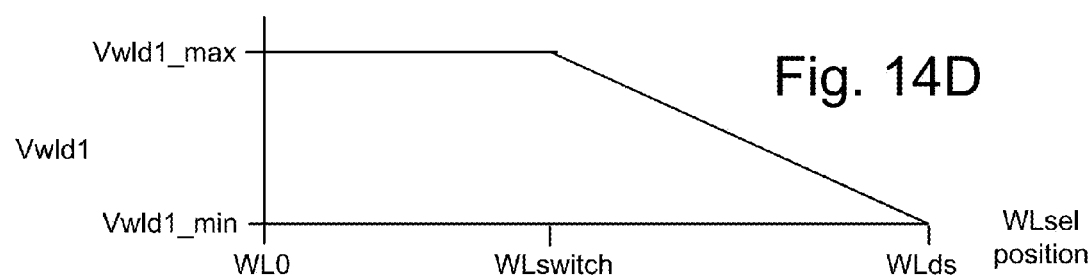
FIG. 14D depicts a plot of dummy word line voltages as a function of a selected word line position, consistent with FIG. 14A, where Vwld1 decreases in a ramp as a function of the selected word line position.

FIG. 14B depicts a plot of dummy word line voltages as a function of a selected word line position, consistent with FIG. 14A, where two levels of voltages are used. In this case, WLd1 has two possible levels based on two possible groups of word lines in which the selected word line is located. A first group comprises WL0-WLy−1, and a second group comprises WLy-WLds. In FIG. 14B-14D, the vertical axis depicts Vwld, a dummy word line voltage for one or more drain-side dummy word lines. The horizontal axis depicts a selected word line (WLse1) position along a NAND string. For example, this could be the position along the z axis, which is the height in a 3D memory device. A solid line 1410 indicates that Vwld1=Vwld1_max when WL0<=WLse1<WLswitch, and Vwld1=Vwld1_min when WLswitch<=WLse1<=WLds. WLswitch is a word line which indicates a switch to a different dummy word line voltage. In the case of a second dummy word line which is adjacent to, and on a drain side of, the first dummy word line, a dashed line 1411 indicates that Vwld2=Vwld2_max when WL0<=WLse1<WLswitch, and Vwld2=Vwld2_min when WLswitch<=WLse1<=WLds. Further, in one approach the level of the voltage applied to the first dummy memory cell (Vwld1) varies in a first range (Vwld1_min to Vwld1_max) in proportion to a distance between the selected word line and the first dummy memory cell. A level of the voltage applied to the second dummy memory cell (Vwld2) varies in a second range (Vwld2_min to Vwld2_max) in proportion to the distance, and the second range is smaller than the first range. As an example, Vwld1_max=5 V, Vwld1_min=0 V, Vwld2_max=4 V and Vwld2_min=2 V. A bottom of the second range is greater than a bottom of the first range, and a top of the second range is less than a top of the first range, in this example.

The optimum switching word line can be affected by factors such as the ambient temperature of the memory device. For example, as temperature increases, electron-hole generation is more severe, so the switchover word line will move further from the drain side. As temperature decreases, electron-hole generation is less severe, so the switchover word line will move closer to the drain side.

A control circuit may be configured to define a switchover word line at a boundary between two adjacent groups, such as the first group and the second group, as a function of temperature, where the switchover word line is relatively closer to the drain-side select gate transistor when the temperature is relatively lower.

The optimum switching word line depends on how many word lines are available to completely absorb the generated electrons from the drain side as well as factors such as the control gate length and the spacing between control gates. Generally, when a memory device has relatively fewer word lines, it is more common for the control gate length and the spacing between control gates to be relatively larger. For example, assume WL30 is an optimum switchover word line in FIG. 14A. There are 17 word lines (WL31-WL47) on its drain side which define the length of the channel that is available to absorb hot carriers. The distance between the switchover word line and the drain-side dummy memory cell is 17/48 or about one third of the total number of word lines.

As a second example, assume there are only 24 word lines. If we assume the same control gate length and the spacing between control gates as in the prior example, the optimum switchover word line is likely around 24-17=WL7. The distance between the switchover word line and the drain-side dummy memory cell is 17/24 or about two-thirds of the total number of word lines. If we assume a larger control gate length and spacing between control gates than in the prior example, the optimum switchover word line is likely around WL8-WL12. The optimum switchover word line may include at least about 50% of the word lines in its source side, as a rough estimate. Generally, the optimum switching word line can be determined from testing.

FIG. 14C depicts a plot of dummy word line voltages as a function of a selected word line position, consistent with FIG. 14A, where three levels of voltages are used. Three or more groups of word lines can be defined with three or more corresponding levels of dummy word line voltage. In a first group, WL0<=WLse1<WLswitch1 and Vwld1=Vwld1_max. In a second group, WLswitch1<=WLse1<WLswitch2 and Vwld1=Vwld1_int. In a third group, WLswitch2<=WLse1<WLds and Vwld1=Vwld1_min. The use of more than two groups provides a transition between the highest and lowest value of Vwld1. WLswitch1 and WLswitch2 are word lines which indicates a switch to a different dummy word line voltage.

For example, based on FIG. 14A, we may have WLswitch1=WL30 and WLswitch2=WL47. FIG. 14A shows that WL0-WL30 is a region where the number of errors is below E1, WL31-WL44 is a region where there a gradual degradation and number of errors exceeds E2, and WL45-WL47 is a region where there a sudden degradation and increase in the number of errors FIG. 14D depicts a plot of dummy word line voltages as a function of a selected word line position, consistent with FIG. 14A, where Vwld1 decreases in a ramp as a function of the selected word line position. In FIGS. 14B and 14C, the dummy word line voltage is varied with the selected word line position according to a step function.

In this example, WLd1 is varied according to a ramp function or other function of the selected word line position. This provides a gradual transition between the highest and lowest value of Vwld1.

FIG. 15A-15D depict plots of a channel voltage (Vch) in an unselected NAND in different scenarios. The channel voltage is depicted after the pre-charge phase and just before Vpgm is applied. The vertical axis depicts Vch and the horizontal axis depicts locations along the NAND string. The locations are sectioned off by dashed lines, where the region between adjacent dashed lines corresponds to a channel region directly under a transistor/word line or to a channel region between transistors/word lines. A focus is on the drain side of the NAND string. SGD is an SGD transistor, WLd1 is a first dummy word line, and WLd2, if present, is a second dummy word lines. WLds is a first drain-side data word line, WLds−1 is a second drain-side data word line and so forth. For example, in FIG. 9A, WLds=WL22. BL is the bit line.

As mentioned at the outset, a channel pre-charge operation before applying a program voltage helps enhance the boosting potential during the subsequent program voltage. The majority of the channel boosting in an unselected NAND string is due to capacitive coupling from the word lines to the channel while the channel voltage is floating. To float the channel voltage, the select gate transistors are turned off (made non-conductive). Then, the word lines are increased. For example, the unselected word line voltages are increased from 0 V to 8-9 V. The selected word line voltage is increased from 0 V to a Vpgm of, e.g., 15-25 V, depending on the program loop. The channel voltage is boosted by the amount of the increase (Vincrease) in the word line voltage multiplied by a coupling ratio (CR). For example: Vch=Vinitial+(Vincrease×CR). Vinitial is the channel voltage before the increase in the word line voltage (e.g., at t3 in FIGS. 16A-16E) and can be, e.g., 0 V or a small value such as 1-2 V which results from the pre-charge operation. Thus, a larger Vinitial results in a larger Vch. Vch is the final channel boosting level when Vpgm is applied (e.g., at t4 in FIG. 16A-16E).

The channel pre-charge operation helps remove residual electrons in the channel and thus boost channel potential. To control the pre-charge efficiency, e.g., the increase in the channel potential increment due to the use of the pre-charge, we can adjust the bias applied on a drain-side dummy word line. Generally, if the control gate/word line voltage of a dummy memory cell is high, the dummy memory cell is fully turned on, and residual electrons can completely be purged away. As a result, the channel potential at the end of the pre-charge operation (Vinitial) is high and boosting is improved. However, it was found that when the dummy word line voltage was changed from 0 V to a high level such as 5 V, channel boosting of the lower word lines, e.g., the word lines closer to the source side of the NAND strings, did improve, but the channel boosting of the higher word lines, e.g., the word lines closer to the drain side of the NAND string, was significantly degraded. The amount of channel boosting can be measured in terms of Er to A state read errors when reading data back after programming.

The degrading of the channel boosting is caused by a channel boosting gradient at the drain side of the NAND string which makes it is easier to generate hot carriers in the polysilicon channel. There is a competition between pre-charge efficiency (residual electron purging capability) and hot carrier generation efficiency. For lower word lines, since the total channel capacitance is larger due to the presence of many word lines/memory cells on the drain side of the selected word line being in the erased state, the hot carriers can easily be absorbed, and the benefit of pre-charge enhancement is more dominant. But, for higher word lines, due to the smaller channel capacitance in the drain side of the selected word line, the hot carrier-induced boosting degradation is more dominant. Thus, the program disturb of the top (drain-side) a word lines becomes worse. The techniques provided herein address this issue.

Figure 15A:
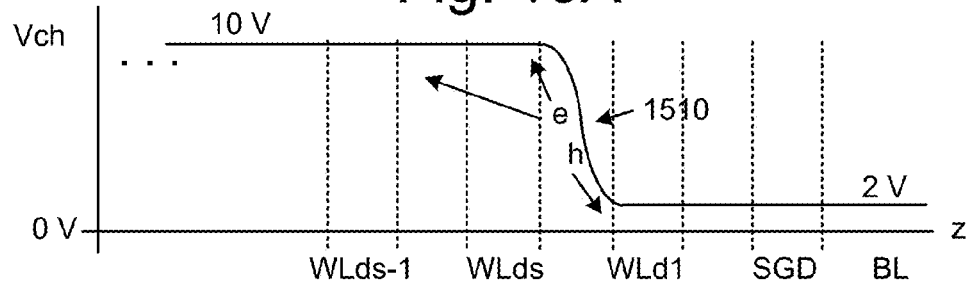
FIG. 15A depicts a plot of a channel voltage in an unselected NAND string, where one drain-side dummy memory cell is used, for the case of WLse1 being relatively far from the drain-side dummy memory cell, and Wld1=high, consistent with plot 1400 of FIG. 14A.

FIG. 15A depicts a plot of a channel voltage in an unselected NAND string, where one drain-side dummy memory cell is used, for the case of WLse1 being relatively far from the drain-side dummy memory cell, and Wld1=high, consistent with plot 1400 of FIG. 14A. Vch may be about 10 V.

Using the above-mentioned formula, Vch=Vinitial+(Vincrease×CR), recall that a positive bit line pre-charge voltage of, e.g., 2 V can easily be passed through the channel from the bit line to the selected word line. Therefore, Vinitial=2 V. Further, with the unselected word lines increased from 0 V to 8 V after the pre-charge phase, and assuming CR=1 for simplicity, we have Vincrease=8 V. Thus, Vch=2+8×1=10 V in the channel portion under the data word lines. In the channel under WLd1, for an unselected NAND string, assume Vwld1=5 V in the pre-charge phase as well as in when Vpgm is applied. Thus, there is no increase in Vwld1 which increases Vch under WLd1 by capacitive coupling. The channel portion under WLd1 therefore remains at about 2 V. This creates a large gradient 1510 which generates electron (e)-hole (h) pairs. The electrons move toward the data word lines while the holes move in an opposite direction. As mentioned, even though electron-hole pairs are generated, they can be absorbed by the channel and not cause program disturb of the data word lines.

Figure 15B:
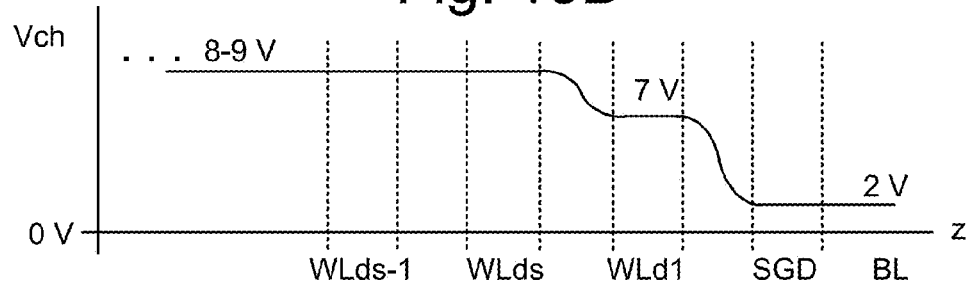
FIG. 15B depicts a plot of a channel voltage in an unselected NAND string, where one drain-side dummy memory cell is used, for the case of WLse1 being relatively close to the drain-side dummy memory cell, and Wld1=low, consistent with plot 1401 of FIG. 14A.

FIG. 15B depicts a plot of a channel voltage in an unselected NAND string, where one drain-side dummy memory cell is used, for the case of WLse1 being relatively close to the drain-side dummy memory cell, and Wld1=low, consistent with plot 1401 of FIG. 14A. In this case, Vwld1 is low so that the dummy memory cell is in a relatively non-conducting state. This blocks most of the bit line pre-charge from reaching the channel, although a small amount of pre-charge may enter the channel. As a result, instead of Vch=10 V as in FIG. 15A, we have Vch=8-9 V. In the channel portion under WLd1, there is an increase in Vwld1 from, e.g., 0 V to 5 V which increases Vch under WLd1. The channel portion under WLd1 is therefore about 7 V instead of 2 V as in FIG. 15A. The SGD transistor is conductive as in FIG. 15A so that the pre-charge of 2 V is passed to the channel portion under SGD. The control gate of the SGD is decreased after the pre-charge, e.g., from a conductive state to a non-conductive state to float the channel and allow it to be boosted higher before Vpgm is applied by the increases in the word line voltages.

Figure 15C:
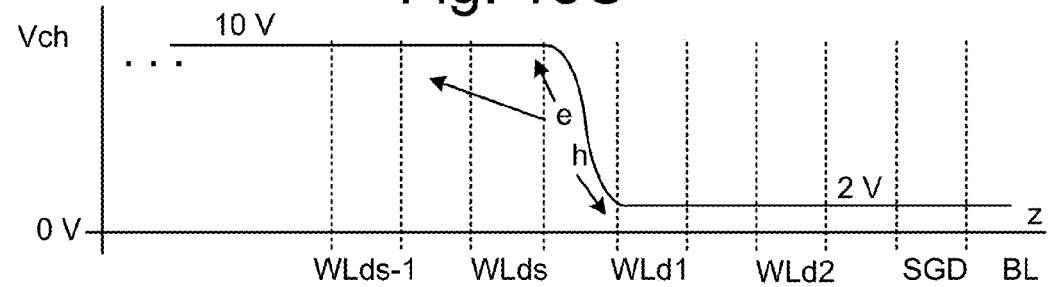
FIG. 15C depicts a plot of a channel voltage in an unselected NAND string, where two drain-side dummy memory cells are used, for the case of WLse1 being relatively far from the drain-side dummy memory cell, Wld1=high and Wld2=high, consistent with plot 1400 of FIG. 14A.

FIG. 15C depicts a plot of a channel voltage in an unselected NAND string, where two drain-side dummy memory cells are used, for the case of WLse1 being relatively far from the drain-side dummy memory cell, Wld1=high and Wld2=high, consistent with plot 1400 of FIG. 14A. Multiple drain-side dummy word lines may be used to provide a larger transition region between WLd1 and SGD which reduces channel gradients. As in FIG. 15A, there is a significant channel gradient between WLd1 and WLd2 which generates e-h pairs, but the electrons can be absorbed before causing program disturb.

Figure 15D:
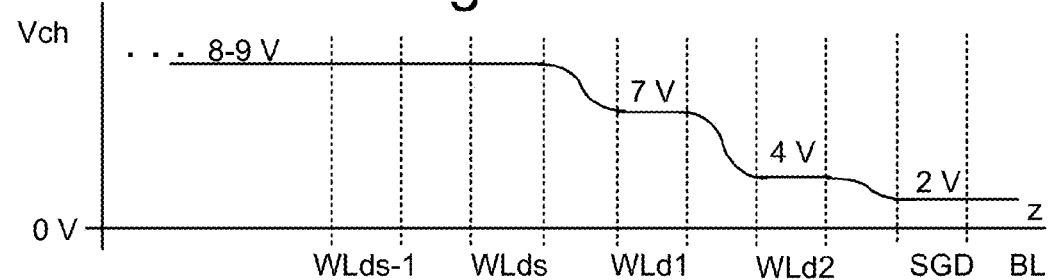
FIG. 15D depicts a plot of a channel voltage in an unselected NAND string, where two drain-side dummy memory cells are used, for the case of WLse1 being relatively close to the drain-side dummy memory cell, Wld1=low and Wld2=low, consistent with plot 1401 of FIG. 14A.

FIG. 15D depicts a plot of a channel voltage in an unselected NAND string, where two drain-side dummy memory cells are used, for the case of WLse1 being relatively close to the drain-side dummy memory cell, Wld1=low and Wld2=low, consistent with plot 1401 of FIG. 14A. In this case, Vwld1 is low so that most of the bit line pre-charge is blocked from reaching the channel. As a result, instead of Vch=10 V as in FIG. 15C, we have Vch=8-9 V. As in FIG. 15B, the channel portion under WLd1 is about 7 V and the channel portion under the SGD transistor is 2 V. Vwld2 may be, e.g., 2 V, during the pre-charge phase and increase to 4 V after the pre-charge phase but before Vpgm is applied. This results in a channel boost of 4−2=2 V above the pre-charge of 2 V, for a total Vch of 4 V.

FIG. 16A-16E depicts example waveforms. The vertical axis is a voltage and the horizontal axis represents increasing time in the program portion of a program loop. The time period of t1-t3 is the pre-charge phase. The time period of t3-t4 is a further boosting phase in which the word line voltages are increased. The time period of t4-t5 is a programming phase in which Vpgm is applied. The time period of t5-t6 and later is a completion phase in which the programming portion of the program loop is completed. Subsequently a verify phase, not shown, may be used to perform one or more verify tests.

Figure 16A:
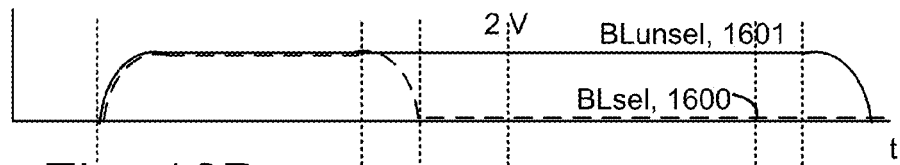
FIG. 16A depicts example bit line voltages as a function of time in a programming operation, including BLse1 for a selected NAND string (plot 1600) and BLunse1 for an unselected NAND string (plot 1601), consistent with FIG. 10.

FIG. 16A depicts example bit line voltages as a function of time in a programming operation, including BLse1 for a selected NAND string (plot 1600) and BLunse1 for an unselected NAND string (plot 1601), consistent with FIG. 10. The bit line voltage (Vb1) is set at a pre-charge level such as 2 V during t1-t2. For an unselected NAND string, from t3-t6, Vb1 remains at 2 V or a similar level. This results in the SGD transistor transitioning from a conductive state to a non-conductive state to float the channel voltage and allow further boosting by capacitive coupling from t3-t4. The memory cells of the unselected NAND string are inhibited from programming After t6, Vb1 returns to 0 V. For a selected NAND string, from t3-t6, Vb1 remains at 0 V or similar level to allow programming of the selected memory cell in the selected NAND string. This results in the SGD transistor remaining in a conductive state.

Figure 16B:
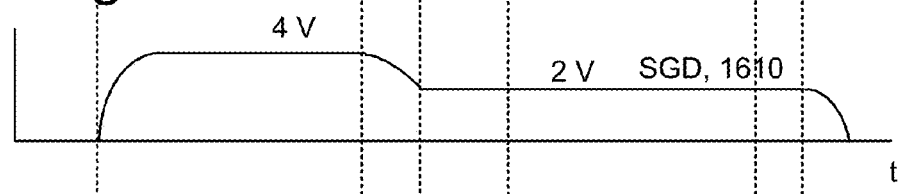
FIG. 16B depicts an example SGD voltage (voltage of drain-side select gate transistors) as a function of time in a programming operation (plot 1610), consistent with FIG. 10.

FIG. 16B depicts an example SGD voltage (voltage of drain-side select gate transistors) as a function of time in a programming operation (plot 1610), consistent with FIG. 10. Vsgd is set at a pre-charge level such as 4 V during t1-t2. From t3-t6, Vsgd is lowered to a level such as 2 V or a similar level. In one example, the selected and unselected NAND string have a common SGD line and each NAND string has a separate bit line. Thus, from t3-t6, Vb1 can be set high to provide the respective SGD transistor in a non-conductive state (where Vsgd−Vth<Vb1) for an unselected NAND string, or low to provide the respective SGD transistor in a conductive state (where Vsgd−Vth>Vb1) for a unselected NAND string. An example Vth of the SGD transistor is 2 V. After t6, Vsgd returns to 0 V. This results in the SGD transistor transitioning to a non-conductive state for all NAND strings.

Figure 16C:
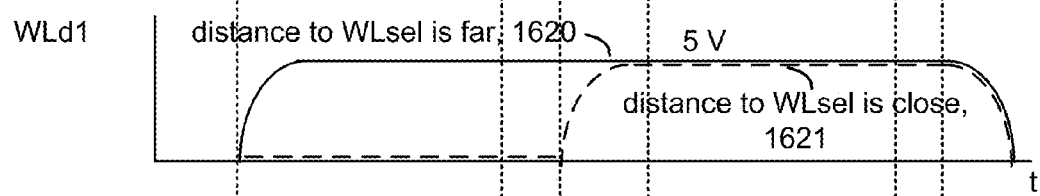
FIG. 16C depicts an example of WLd1 (a voltage of a first drain-side dummy word line) as a function of time in a programming operation, for cases where a distance to WLse1 from WLd1 is relatively far (plot 1620) or relatively close (plot 1621), consistent with FIG. 10.

FIG. 16C depicts an example of WLd1 (a voltage of a first drain-side dummy word line) as a function of time in a programming operation, for cases where a distance to WLse1 from WLd1 is relatively far (plot 1620) or relatively close (plot 1621), consistent with FIG. 10. From t1-t3, when the distance is relatively far, WLd1 is set to a high level, e.g., 5 V and when the distance is relatively close, WLd1 is set to a low level, e.g., 0 V. From t3-t6, WLd1 can be set to the high level for close or far distances.

Figure 16D:
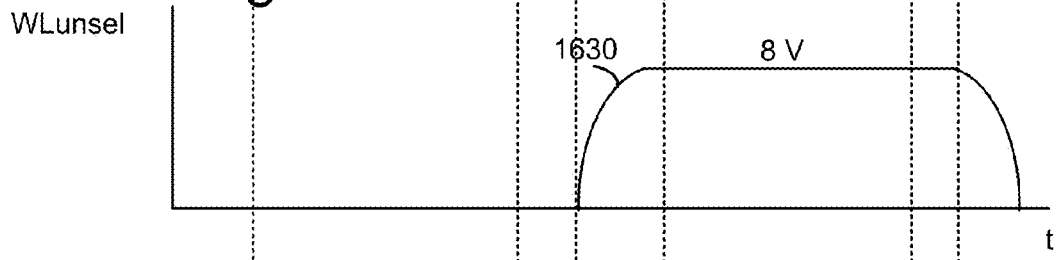
FIG. 16D depicts an example of WLunse1 (a voltage of unselected word lines) (plot 1630) as a function of time in a programming operation.

FIG. 16D depicts an example of WLunse1 (a voltage of unselected word lines) (plot 1630) as a function of time in a programming operation. WLunse1 increases from a low level such as 0 V to a pass voltage such as 8-9 V at t3-t4 and remains at that level from t4-t5 before returning to 0 V.

Figure 16E:
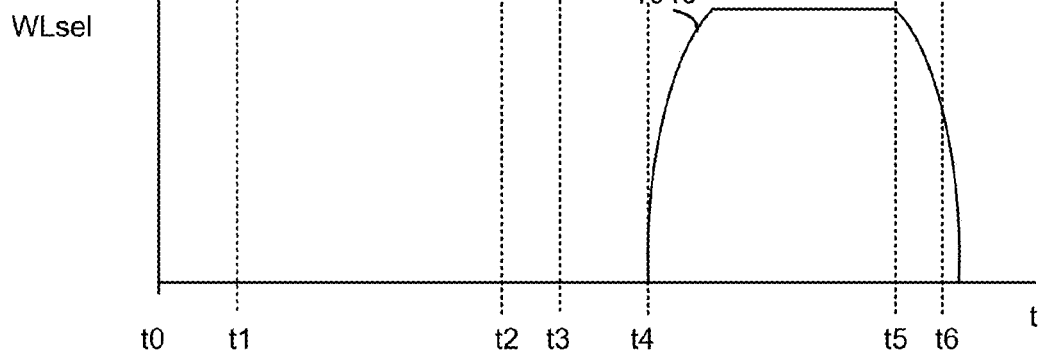
FIG. 16E depicts an example of WLse1 (a voltage of a selected word line) (plot 1640) as a function of time in a programming operation.

FIG. 16E depicts an example of WLse1 (a voltage of a selected word line) (plot 1640) as a function of time in a programming operation. WLse1 increases from a low level such as 0 V to a program voltage (Vpgm) such as 15-25 V at t3-t4 and remains at that level from t4-t5 before returning to 0 V.

Accordingly, it can be seen that, in one embodiment, a memory device comprises a plurality of NAND strings comprising a selected NAND string and an unselected NAND string, wherein: the selected NAND string comprises a plurality of memory cells including a selected memory cell and unselected memory cells; the unselected NAND string comprises a plurality of memory cells including an unselected memory cell corresponding to the selected memory cell and remaining unselected memory cells; each NAND string of the plurality of NAND strings comprises a respective channel, a drain-side select gate transistor, and a first dummy memory cell; the first dummy memory cell is between the drain-side select gate transistor and a drain-end memory cell of the plurality of memory cells; each NAND string of the plurality of NAND strings is connected to a respective bit line of a plurality of bit lines; the selected memory cell and the unselected memory cell corresponding to the selected memory cell are connected to a selected word line among a plurality of word lines; and the unselected memory cells of the selected NAND string and the remaining unselected memory cells of the unselected NAND string are connected to unselected word lines among the plurality of word lines; and a control circuit. The control circuit configured, for the unselected NAND string, to perform a pre-charge operation prior to application of a program voltage to the selected word line in a programming operation, wherein to perform the pre-charge operation, the control circuit is configured to concurrently apply a positive pre-charge voltage to the respective bit line of the unselected NAND string and a voltage to the first dummy memory cell, wherein a level of the voltage applied to the first dummy memory cell is a function of a distance between the selected word line and the first dummy memory cell such that the level is higher when the distance is greater.

In another embodiment, a method for programming in a memory device comprises: for an unselected NAND string, during a programming operation for a selected memory cell in a selected NAND string, where the selected memory cell is connected to a selected word line, performing a pre-charge operation by concurrently apply a positive pre-charge voltage to a respective bit line of the unselected NAND string and a voltage to a first dummy memory cell of the unselected NAND string, wherein a level of the voltage applied to the first dummy memory cell is a function of a distance between a selected word line and the first dummy memory cell such that the level is higher when the distance is greater, and the first dummy memory cell is between a drain-side select gate transistor and a drain-end memory cell of a plurality of memory cells of the unselected NAND string; and after the pre-charge operation, applying a program voltage to the selected word line.

In another embodiment, a memory device comprises means for performing each of the steps in the above-mentioned method.

In another embodiment, a memory device comprises: a plurality of NAND strings comprising a selected NAND string and an unselected NAND string, wherein: the selected NAND string comprises a plurality of memory cells including a selected memory cell and unselected memory cells; the unselected NAND string comprises a plurality of memory cells including an unselected memory cell corresponding to the selected memory cell and remaining unselected memory cells; each NAND string of the plurality of NAND strings comprises a respective channel, a drain-side select gate transistor, and a first dummy memory cell; the first dummy memory cell is between the drain-side select gate transistor and a drain-end memory cell of the plurality of memory cells; each NAND string of the plurality of NAND strings is connected to a respective bit line of a plurality of bit lines; the selected memory cell and the unselected memory cell corresponding to the selected memory cell are connected to a selected word line among a plurality of word lines; and the unselected memory cells of the selected NAND string and the remaining unselected memory cells of the unselected NAND string are connected to unselected word lines among the plurality of word lines; and a control circuit. The control circuit configured, for the unselected NAND string, to perform a pre-charge operation prior to application of a program voltage to the selected word line in a programming operation, wherein to perform the pre-charge operation, the control circuit is configured to concurrently apply a positive pre-charge voltage to the respective bit line of the unselected NAND string and to control the first dummy memory cell to control an amount of the positive pre-charge voltage which is passed from the respective bit line to the respective channel, wherein the amount is a function of a distance between the selected word line and the first dummy memory cell such that the amount is higher when the distance is greater.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A memory device, comprising:
   a plurality of NAND strings comprising a selected NAND string and an unselected NAND string, wherein:

the selected NAND string comprises a plurality of memory cells including a selected memory cell and unselected memory cells;

the unselected NAND string comprises a plurality of memory cells including an unselected memory cell corresponding to the selected memory cell and remaining unselected memory cells;

each NAND string of the plurality of NAND strings comprises a respective channel, a drain-side select gate transistor, and a first dummy memory cell;

the first dummy memory cell is between the drain-side select gate transistor and a drain-end memory cell of the plurality of memory cells;

each NAND string of the plurality of NAND strings is connected to a respective bit line of a plurality of bit lines;

the selected memory cell and the unselected memory cell corresponding to the selected memory cell are connected to a selected word line among a plurality of word lines; and the unselected memory cells of the selected NAND string and the remaining unselected memory cells of the unselected NAND string are connected to unselected word lines among the plurality of word lines; and a control circuit, the control circuit configured, for the unselected NAND string, to perform a pre-charge operation prior to application of a program voltage to the selected word line in a programming operation, wherein to perform the pre-charge operation, the control circuit is configured to concurrently apply a positive pre-charge voltage to the respective bit line of the unselected NAND string and a voltage to the first dummy memory cell, wherein a level of the voltage applied to the first dummy memory cell is a function of a distance between the selected word line and the first dummy memory cell such that the level is higher when the distance is greater.

2. The memory device of claim 1, wherein:
according to the function of the distance, the control circuit is configured to provide the level of the voltage applied to the first dummy memory cell at a first value when the selected word line is among a first group of word lines of the plurality of word lines, and at a second value which is less than the first value, when the selected word line is among a second group of word lines of the plurality of word lines;

the first group of word lines comprises 50-80% of the plurality of word lines; and the second group of word lines comprises a remainder of the plurality of word lines.

3. The memory device of claim 2, wherein:
the control circuit is configured to define a switchover word line at a boundary between the first group and the second group as a function of temperature; and the switchover word line is relatively closer to the drain-side select gate transistor when the temperature is relatively lower.

4. The memory device of claim 1, wherein:
according to the function of the distance, the control circuit is configured to provide the level of the voltage applied to the first dummy memory cell at a first value when the selected word line is among a first group of word lines of the plurality of word lines, and at a second value which is less than the first value, when the selected word line is among a second group of word lines of the plurality of word lines; and a distance between the selected word line in the first group and the first dummy memory cell is greater than a distance between the selected word line in the second group and the first dummy memory cell.

5. The memory device of claim 4, wherein:
according to the function of the distance, the control circuit is configured to provide the level of the voltage applied to the first dummy memory cell at a third value which is less than the second value when the selected word line is among a third group of word lines of the plurality of word lines; and a distance between the selected word line in the second group and the first dummy memory cell is greater than a distance between the selected word line in the third group and the first dummy memory cell.

6. The memory device of claim 1, wherein:
when the distance is a maximum, the level of the voltage applied to the first dummy memory cell is greater than a threshold voltage of the first dummy memory cell.

7. The memory device of claim 1, wherein:
when the distance is a minimum, the level of the voltage applied to the first dummy memory cell is less than a threshold voltage of the first dummy memory cell.

8. The memory device of claim 1, wherein:
the first dummy memory cell is adjacent to a drain-side data word line among the plurality of word lines.

9. The memory device of claim 8, wherein:
each NAND string of the plurality of NAND strings comprises a second dummy memory cell between the first dummy memory cell and the drain-side select gate transistor, adjacent to the first dummy memory cell;

the control circuit is configured to apply a voltage to the second dummy memory cell concurrent with the voltage applied to the first dummy memory cell;

the level of the voltage applied to the first dummy memory cell varies in a first range in proportion to the distance;

a level of the voltage applied to the second dummy memory cell varies in a second range in proportion to the distance; and the second range is smaller than the first range.

10. The memory device of claim 9, wherein:
a bottom of the second range is greater than a bottom of the first range; and a top of the second range is less than a top of the first range.

11. The memory device of claim 1, wherein for the unselected NAND string:
the control circuit is configured to provide the drain-side select gate transistor in a conductive state concurrent with the voltage applied to the first dummy memory cell and in a non-conductive state concurrent with the application of the program voltage.

12. The memory device of claim 1, wherein for the selected NAND string, concurrent with the voltage applied to the first dummy memory cell:
the control circuit is configured to provide the drain-side select gate transistor in a conductive state, and to apply 0 V to the respective bit line.

13. The memory device of claim 1, wherein:
the memory device comprises a three-dimensional stacked memory device in which the plurality of word line are arranged in different layers of a stack and the channels extend vertically in the stack.

14. The memory device of claim 1, wherein:
the unselected NAND string comprises a source-side select gate transistor;

in the unselected NAND string, during the pre-charge operation, unselected memory cells between the selected word line and the first dummy memory cell are in an erased state; and
unselected memory cells between the selected word line and the source-side select gate transistor are in a programmed state.

15. A method for programming in a memory device, comprising:
for an unselected NAND string, during a programming operation for a selected memory cell in a selected NAND string, where the selected memory cell is connected to a selected word line, performing a pre-charge operation by concurrently apply a positive pre-charge voltage to a respective bit line of the unselected NAND string and a voltage to a first dummy memory cell of the unselected NAND string, wherein a level of the voltage applied to the first dummy memory cell is a function of a distance between the selected word line and the first dummy memory cell such that the level is higher when the distance is greater, and the first dummy memory cell is between a drain-side select gate transistor and a drain-end memory cell of a plurality of memory cells of the unselected NAND string; and
after the pre-charge operation, applying a program voltage to the selected word line.

16. The method of claim 15, further comprising:
in the programming operation, repeating the performing the pre-charge operation and the applying the program voltage to the selected word line in each program loop of a plurality of program loops.

17. The method of claim 15, wherein:
the level of the voltage applied to the first dummy memory cell is a first value when the selected word line is among a first group of word lines of a plurality of word lines, and a second value which is less than the first value, when the selected word line is among a second group of word lines of the plurality of word lines;
the first group of word lines comprises 50-75% of the plurality of word lines; and
the second group of word lines comprises a remainder of the plurality of word lines.

18. The method of claim 15, wherein the first dummy memory cell is adjacent to a drain-side data word line among a plurality of word lines, and the unselected NAND string comprises a second dummy memory cell between the first dummy memory cell and the drain-side select gate transistor, adjacent to the first dummy memory cell, the method further comprising:
applying a voltage to the second dummy memory cell concurrently with the applying the voltage applied to the first dummy memory cell, wherein the level of the voltage applied to the first dummy memory cell varies in a first range in proportion to the distance, a level of the voltage applied to the second dummy memory cell varies in a second range in proportion to the distance, and the second range is smaller than the first range.

19. A memory device, comprising:
a plurality of NAND strings comprising a selected NAND string and an unselected NAND string, wherein:
the selected NAND string comprises a plurality of memory cells including a selected memory cell and unselected memory cells;
the unselected NAND string comprises a plurality of memory cells including an unselected memory cell corresponding to the selected memory cell and remaining unselected memory cells;
each NAND string of the plurality of NAND strings comprises a respective channel, a drain-side select gate transistor, and a first dummy memory cell;
the first dummy memory cell is between the drain-side select gate transistor and a drain-end memory cell of the plurality of memory cells;
each NAND string of the plurality of NAND strings is connected to a respective bit line of a plurality of bit lines;
the selected memory cell and the unselected memory cell corresponding to the selected memory cell are connected to a selected word line among a plurality of word lines; and
the unselected memory cells of the selected NAND string and the remaining unselected memory cells of the unselected NAND string are connected to unselected word lines among the plurality of word lines; and
a control circuit, the control circuit configured, for the unselected NAND string, to perform a pre-charge operation prior to application of a program voltage to the selected word line in a programming operation, wherein to perform the pre-charge operation, the control circuit is configured to concurrently apply a positive pre-charge voltage to the respective bit line of the unselected NAND string and to control the first dummy memory cell to control an amount of the positive pre-charge voltage which is passed from the respective bit line to the respective channel, wherein the amount is a function of a distance between the selected word line and the first dummy memory cell such that the amount is higher when the distance is greater.

20. The memory device of claim 19, wherein:
the first dummy memory cell is adjacent to a drain-side data word line among the plurality of word lines;
each NAND string of the plurality of NAND strings comprises a second dummy memory cell between the first dummy memory cell and the drain-side select gate transistor, adjacent to the first dummy memory cell;
the control circuit is configured to control the second dummy memory cell concurrent with the control of the first dummy memory cell;
a level of a control gate voltage applied to the first dummy memory cell varies in a first range in proportion to the distance;
a level of a control gate voltage applied to the second dummy memory cell varies in a second range in proportion to the distance; and
the second range is smaller than the first range.

* * * * *